(12) United States Patent
Gilliland et al.

(10) Patent No.: US 6,416,238 B1
(45) Date of Patent: Jul. 9, 2002

(54) MODULAR HIGH DENSITY MULTIPLE OPTICAL TRANSMITTER/RECEIVER ARRAY

(75) Inventors: Patrick B. Gilliland, Chicago; Carlos Jines, Forest Park, both of IL (US)

(73) Assignee: Stratos Lightwave, Inc., Chicago, IL (US)

( * ) Notice: Subject to any disclaimer, the term of this patent is extended or adjusted under 35 U.S.C. 154(b) by 0 days.

(21) Appl. No.: 09/633,511

(22) Filed: Aug. 7, 2000

(51) Int. Cl.[7] .................................................. G02B 6/42
(52) U.S. Cl. .......................................... 385/88; 385/92
(58) Field of Search ..................... 385/88–94

(56) References Cited

U.S. PATENT DOCUMENTS

| | | | |
|---|---|---|---|
| 5,195,156 A | 3/1993 | Freeman et al. | 385/92 |
| 5,337,396 A | 8/1994 | Chen et al. | 385/92 |
| 5,475,783 A | 12/1995 | Kurashima | 385/92 |
| 5,586,208 A | * 12/1996 | Nishiyama | 385/93 |
| 5,638,390 A | 6/1997 | Gilliland et al. | 372/38 |
| 5,812,582 A | 9/1998 | Gilliland et al. | 372/50 |
| 5,812,717 A | * 9/1998 | Gilliland | 385/93 |
| 5,815,623 A | 9/1998 | Gilliland et al. | 385/93 |
| RE36,491 E | 1/2000 | Gilliland et al. | 372/38 |
| 6,113,283 A | * 9/2000 | Blom | 385/92 |
| 6,213,651 B1 | * 4/2001 | Jiang et al. | 385/92 |
| 6,243,508 B1 | * 6/2001 | Jewell et al. | 385/93 X |

FOREIGN PATENT DOCUMENTS

| | | |
|---|---|---|
| WO | WO 00/73833 A1 | 12/2000 |
| WO | WO 00/74277 A1 | 12/2000 |

OTHER PUBLICATIONS

Infineon Technologies, Data Sheet, "V23814–U1306–M130, Parallel Optical Link: PAROLI Tx AC, 1.6 Gbit/s; and V23815–U1306–M130, Parallel Optical Link: PAROLI Rx AC, 1.6 Gbit/s," Sep. 1999 (9 pages).

* cited by examiner

*Primary Examiner*—John D. Lee
(74) *Attorney, Agent, or Firm*—Karl D. Kovach

(57) ABSTRACT

A device or array of arrayed optical subassemblies includes modular units called one channel sub-assemblies. Each of the one channel sub-assemblies includes a small format optical subassembly attached to a substrate and an optical coupling element all of which is connected to a base. The optical coupling element includes a focusing element and a ferrule receiving bore. The arrayed device makes it possible to remove and replace one of the one channel sub-assemblies with another one channel sub-assembly. The small format optical subassembly of the one channel sub-assembly may be a transmitter or a receiver. Thus, the device is a modular, high-density, multiple optical transmitter/receiver array.

14 Claims, 32 Drawing Sheets

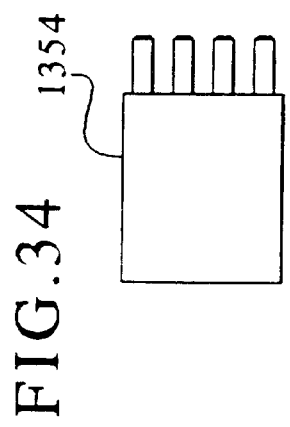
FIG.34
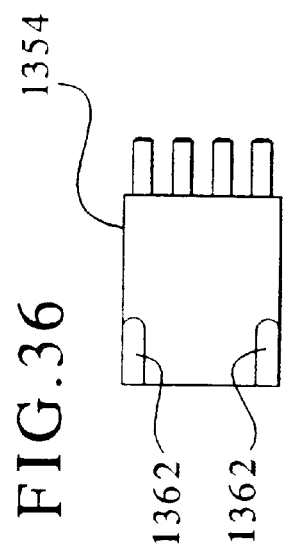
FIG.35
FIG.36
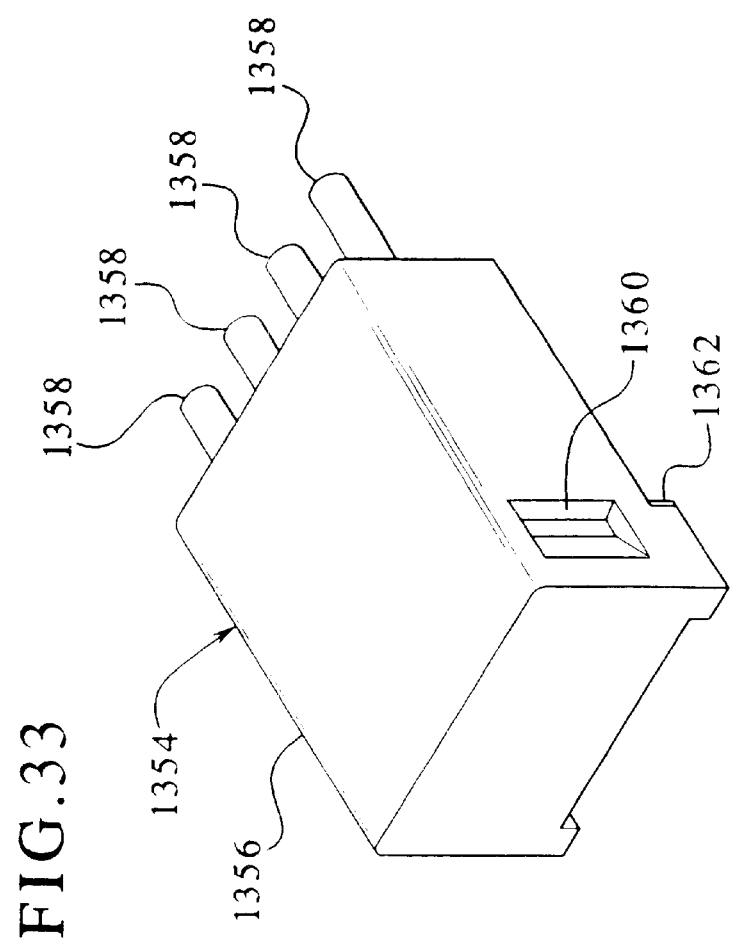
FIG.33

MODULAR HIGH DENSITY MULTIPLE OPTICAL TRANSMITTER/RECEIVER ARRAY

BACKGROUND OF THE INVENTION

1. Field of the Invention

The present invention pertains to optoelectronic devices and packages. The invention more particularly concerns a high density optoelectronic device such as an array which includes multiple, modular transmitters and/or receivers.

2. Discussion of the Background

Optoelectronic devices such as optical transceivers are known in the art and include active optical devices or diode packages. Common diode packages include LED packages such as a TO-46 package or a 5.6 mm TO style laser diode package such as an RLD-85PC diode package by Rohm, Incorporated. These diode packages or TO cans typically include a metallic housing having a laser diode or LED for transmitting data and a photo diode for performing power-monitoring, metal contact leads exiting from the diodes for connection to a power source and a cover glass opposed to the diode, through which the energy is transmitted. Discussion of the power-monitoring and feedback control of the laser diode by the photo diode is presented in U.S. Pat. Nos. 5,812,582 and 5,815,623. U.S. Pat. Nos. 5,812,582 and 5,815,623 are hereby incorporated herein by reference. The TO can is hermetically sealed. Often, optics housings are metallic so as to provide ruggedness, ease of machining complicated shapes, and to enhance shielding of electromagnetic fields.

Smaller optoelectronic packages allow the devices into which the optoelectronic packages are placed to become smaller. Smaller optoelectronic packages allow for a higher density of data transmission in a given space. Currently, there is a great demand for smaller optoelectronic packages.

FIG. 8 is a partial cross-sectional pictorial view of an optoelectronic package 200. The optoelectronic package 200 includes a base element 212, posts 206, 208, 210, extending through the base element 212 and secured thereto with solidified molten glass 214, a monitor diode 204 mounted on the base element 212, an optical emitting element 202 mounted on the monitor diode 204, a can 218 and lens 216 enclosing the monitor diode 204 and the optical emitting element 202. In an effort to reduce space, the optical emitting element 202 is mounted on top of the monitor diode 204. Electrically conductive posts 206, 208, 210 extend through through-holes in the electrically conductive base element 212. The posts 206, 208, 210 are electrically insulated from the base element 212 by solidified molten glass 214 which also attaches the posts 206, 208, 210 to the base element 212. The posts 206, 208, 210 are large as compared to the other components and require a large area for their mounting and placement.

At minimum, the diameter across the base element 212 is approximately 3.8 millimeters, as incorporated on the SLT2160-LN series of transmitter optical sub-assemblies manufactured by Sumitomo Electric Industries, Ltd. Thus, if two of these devices are placed side-by-side, on the same plane, the distance between the optical axes is, hypothetically, at best, 3.8 millimeters. However, typically, the optical axes are separated by 6.25 millimeters, due to packaging constraints as in typical LC duplex transceivers such as Methode Electronics, Inc.'s, part number MLC-25-4-X-TL which is described in the data sheet entitled, "MLC-25-4-X-TL Optical Gigabit Ethernet—+3.3V Small Form Factor (SFF) Transceiver—1.25 GBaud." Furthermore, the MLC-25-4-X-TL transceiver includes a transmitter and a receiver hardwired to the device.

SUMMARY OF THE INVENTION

Therefore, it is an object of the present invention to provide a high density optoelectronic device or array which includes optoelectronic subassemblies such as transmitters and receivers.

It is still another object of the invention to provide an optoelectronic device which includes modular components so as to enable the custom assembly of an array of transmitters or an array of receivers or an array of a combination of transmitters and receivers.

It is yet another object of the invention to provide an arrayed device having modular components so that individual components, such as transmitters and/or receivers, can be easily removed or inserted for replacement, repair, or changed operating parameters.

It is a further object of the invention to provide an optoelectronic device which is easy to install, and provides for more efficient utilization of limited space.

It is another object of the invention to provide an optoelectronic device which is inherently eye safe.

In one form of the invention, the one channel sub-assembly includes a small format optical subassembly attached to an optical coupling element and a substrate. The optical coupling element includes a focusing element, and a ferrule receiving bore. The small format optical subassembly is attached to the optical coupling element. The optical coupling element may also include a metal portion, where the metal portion is laser welded to the small format optical subassembly. Furthermore, the one channel sub-assembly may be an optical transmit channel or an optical receive channel.

In another form of the invention, the device includes two one channel sub-assemblies, where each one channel sub-assembly is constructed as discussed in the above embodiment. Furthermore, the ferrule receiving bores of each of the one channel sub-assemblies are parallel to each other. Additionally, each of the ferrule receiving bores are separated by a distance.

In yet another form of the invention, the device includes a housing, first and second one channel sub-assemblies mounted and removeably inserted within the housing, and a cover removeably attached to the housing. The cover and the housing retain the first and second one channel sub-assemblies therein. The device provides for modification and interchangeability of the modularly array one channel sub-assemblies for repair or replacement within the housing.

Thus, the device of the invention is superior to existing optoelectronic devices that include optoelectronic subassemblies. The modular high density multiple transmitter/receiver array of the invention eliminates the use of large, bulky components, and replaces them with a smaller component through use of a unique combination of materials and arrangement of the materials. Thus, the device of the invention is smaller than prior art devices.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 33 is a perspective view of a plug connector;

FIG. 34 is a top view of the plug connector of FIG. 33;

FIG. 35 is a side view of the plug connector of FIG. 33;

FIG. 36 is a bottom view of the plug connector of FIG. 33;

DETAILED DESCRIPTION OF THE PRESENTLY PREFERRED EMBODIMENTS

Figure 1:
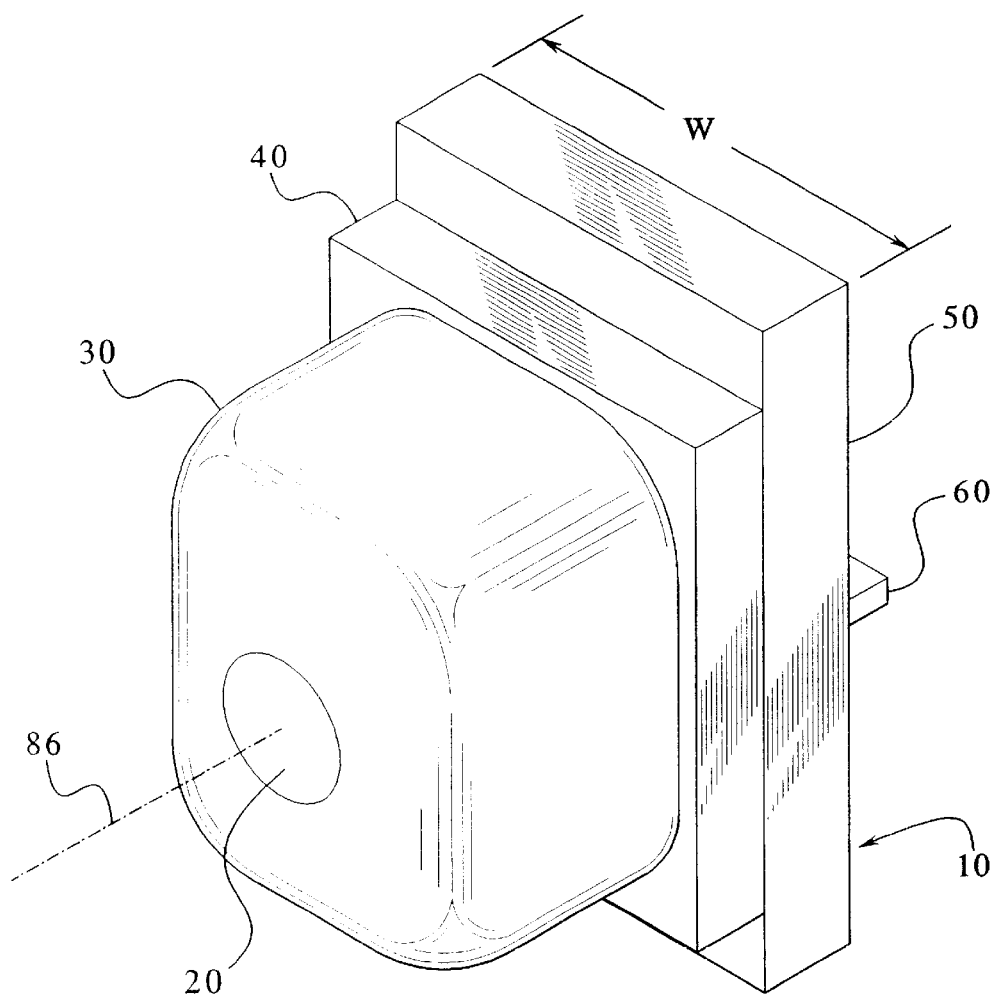
FIG. 1 is a perspective view of an optoelectronic package.

Referring now to the drawings, wherein like reference numerals designate identical or corresponding parts throughout the several views, and more particularly to FIGS. 20–39 thereof, is a modular, high-density, multiple optical transmitter/receiver array 1300. Firstly, however, the embodiments disclosed in FIGS. 1–19 are discussed so as to introduce and set the stage for the embodiments discussed in FIGS. 20–37.

The small format optoelectronic package or device 300, 400, 500 is better understood by reference to FIGS. 1–19 which show various aspects and embodiments of a small format optoelectronic package. However, a small format optoelectronic package or device 10, 110 as shown in FIGS. 1–7 is discussed first since the embodiments disclosed in FIGS. 9–19 depend on the disclosure of the devices 10, 110.

FIG. 1 is a perspective view of the optoelectronic package 10 which shows a transparent element 20 mounted in an electrically conductive can 30, where the electrically conductive can 30 is mounted on and sealed to an electrically conductive plating adhered to a non-electrically conductive substrate. The device 10 can be attached to a housing of another structure by way of the holder 50.

The holder 50 is mounted to the non-electrically conductive substrate 40. The holder 50 has a width dimension W. A flex connector 60 is attached to a second side of the non-electrically conductive substrate 40.

Figure 2:
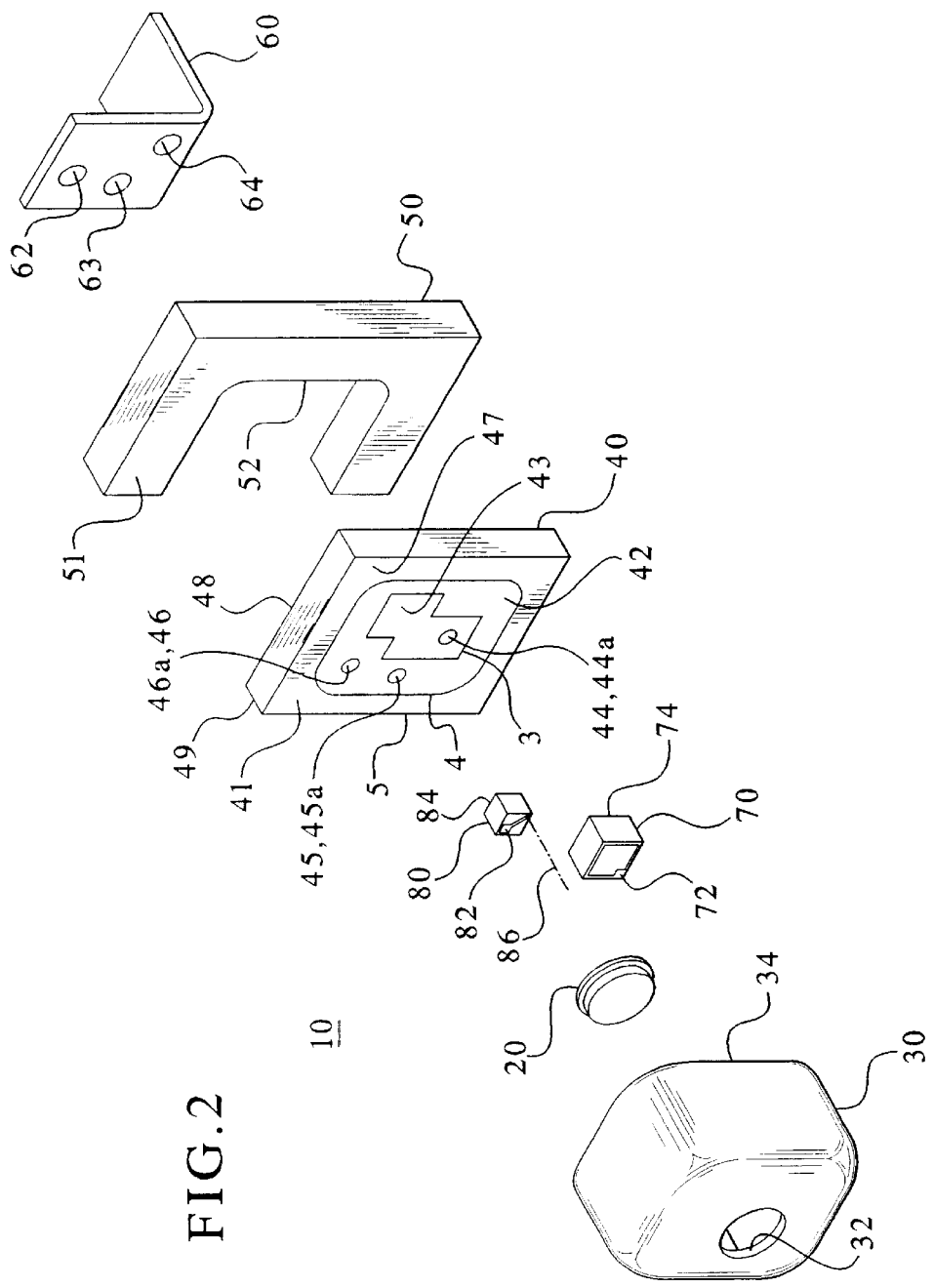
FIG. 2 is an exploded perspective view of the optoelectronic package of FIG. 1.

FIG. 2 is an exploded perspective view of the optoelectronic package 10 of FIG. 1. The electrically conductive can 30 has a first aperture 32 and a second aperture 34. The transparent element 20 is mounted on and sealed to the first aperture 32 of the electrically conductive can 30 by means known in the art. One means includes using glass frit powder packed around the transparent element 20 while it is in the first aperture 32 of the electrically conductive can 30 and then firing the assembly so as to cause the glass frit powder to flow and to bond and to hermetically seal the transparent element 20 in the first aperture 32. Another means includes molding or flowing molten glass into the first aperture 32 and letting the molten glass solidify, thus forming the transparent element 20. The non-electrically conductive substrate 40 has a first surface 47 and a second surface 48 separated by a thickness as identified along edge 49, the thickness is between 0.008 inches and 0.025 inches, however, the thickness can go up to 0.035 inches. The first surface 47 is divided into 3 regions. The first region 43 is bound by line 3. The second region 42 is bound by lines 3 and 4. The third region 41 is bound by lines 4 and 5. The regions include a first region 43, a second region 42, and a third region 41. The first region 43 is separated from the third region 41 by the second region 42.

The non-electrically conductive substrate 40 includes three through-holes. The three through-holes include the first through-hole 44, a second through-hole 46, and a third through-hole 45. Each through-hole has a diameter of approximately 0.010 inches. An electrically conductive plating or coating is adhered to the first surface 47 of the non-electrically conductive substrate 40 in the first region 43 and in the third region 41. The plating typically has a thickness of 0.003 inches. Furthermore, the electrically conductive material, which can be the same as the plating material, substantially fills the first through-hole 44, the second through-hole 46, and the third through-hole 45, so as to form first, second, and third conductive vias 44a, 46a, and 45a, respectively. Each electrically conductive via is substantially co-planar with the surfaces 47, 48 of the non-electrically conductive substrate 40. Specifically, the vias do not substantially protrude into the space defined by the transparent element 20, the electrically conductive can 30, and the non-electrically conductive substrate 40, so as to enable surface mounting of components directly on top of the vias. The first conductive via is electrically connected to the electrically conductive plating of the first region 43. The optical diode 80 has a first lead 82 and a second lead 84. The optical emitting diode 80 has an optical axis 86 along which optical energy is transmitted. The second lead 84 of the optical diode 80 is electrically connected to an electrically conductive plating of the first region 43 and mounted thereto by way of electrically conductive epoxy (not shown). The monitor diode 70 has a first lead 74 and a second lead 72. The first lead 74 of the monitor diode 70 is electrically connected to the electrically conductive plating of the first region 43. The monitor diode 70 is mounted to the electrically conductive plating of the first region 43 by way of electrically conductive epoxy (not shown). A longitudinal axis of the first through-hole 44 passes through the monitor diode 70. However, the optical diode 70 can be placed over the first through-hole 44 instead of the monitor diode 80.

To attach the holder 50 to the non-electrically conductive substrate 40, a portion of the second surface 48 has the electrically conductive plating adhered thereto and to which the holder 50 is either brazed or soldered. Alternatively, glass frit powder can be placed between the holder 50 and the non-electrically conductive substrate 40 and then the assembly is fired so as to bond the holder 50 to the non-electrically conductive substrate.

The electrically conductive can 30 is then mounted on and sealed to the third region 41 of the non-electrically conductive substrate 40. The electrically conductive can 30 is soldered to electrically conductive plating adhered to the third region 41. The optical emitting diode 80 and monitor diode 70 are hermetically sealed and protected from atmospheric and environmental contaminants. Preferably, the sealed-off region is filled with a dry inert gas. Examples of the inert gas include nitrogen and argon. In another embodiment, the sealed-off region is in a vacuum. The holder 50 has a first surface 51 and a concave portion 52. The first surface 51 is soldered to electrically conductive plating adhered to the non-electrically conductive substrate. The flex connector 60 has three conductive traces, which includes a first conductive trace 64, a second conductive trace 62, and a third conductive trace 63. The flex connector 60 may be formed of a polyimide film, such a material is marketed under the trade name, KAPTON, which is sold by E.I. Du Pont de Nemours and Company. The conductive traces 62, 63, and 64 transmit electrical data and power signals to the diodes 70, 80. The flex connector 60 passes through the concave portion 52 of the holder 50 and each of the conductive traces electrically connects with respective electrically conductive vias. That is, the first conductive trace 64 electrically connects to conductive via 44a, electrically conductive trace 62 electrically connects to electrically conductive via 46a, and electrically conductive trace 63 electrically connects to electrically conductive via 45a.

Figure 3:
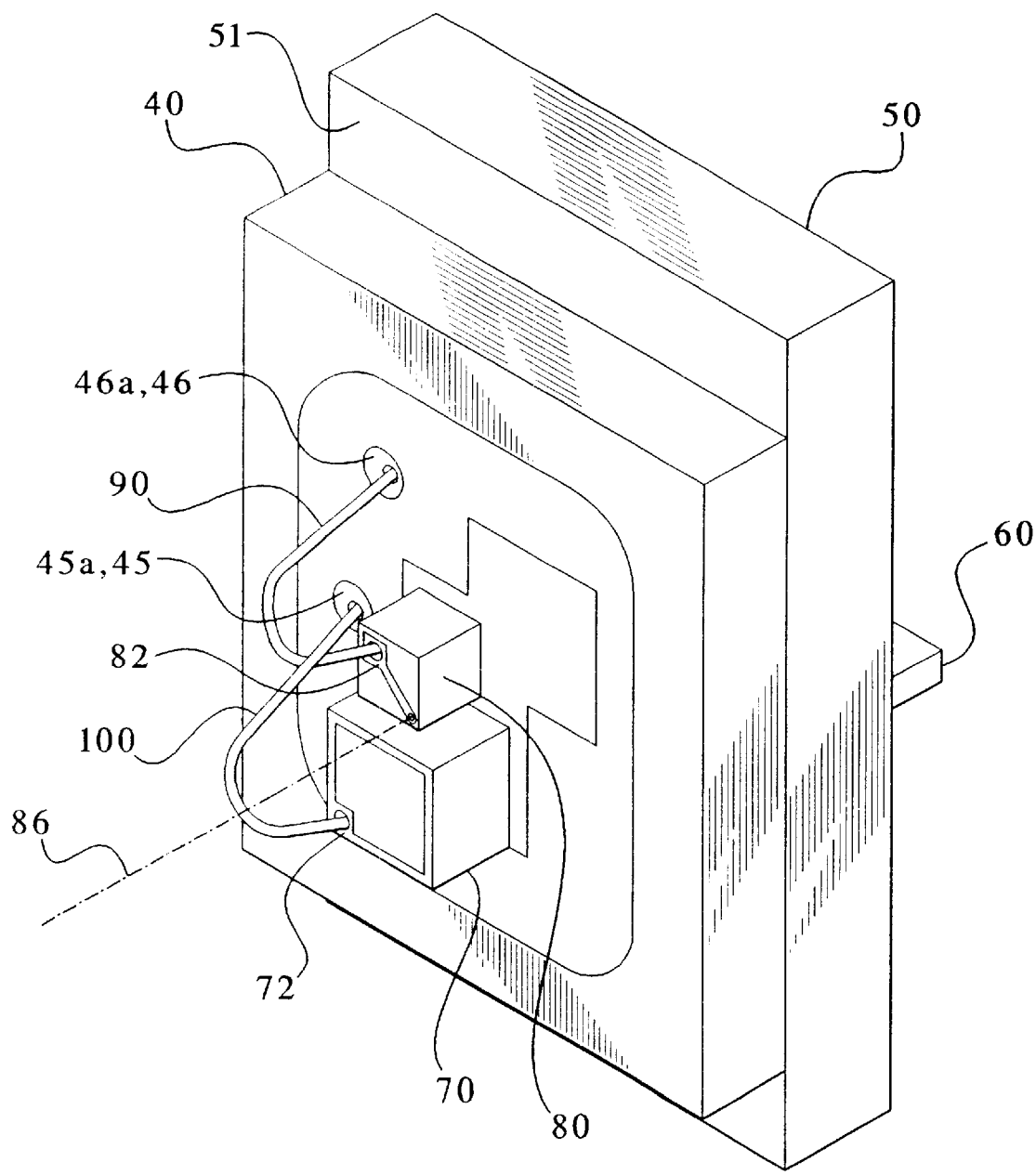
FIG. 3 is a perspective view of the monitor diode, optical diode, base substrate, holder, and flex connector of the optoelectronic package of FIG. 1.

FIG. 3 is a perspective view of the monitor diode 70, the optical diode 80, the nonelectrically conductive substrate 40, the holder 50, and the flex connector 60 of the small format optoelectronic package 10 of FIG. 1. FIG. 3 shows the optical diode 80 and the monitor diode 70 mounted to the first region 43 of the non-electrically conductive substrate 40. FIG. 3 further shows the optical axis 86 of the optical diode 80. A first conductor 90, for example, a wire bond, electrically connects the first lead 82 of the optical diode 80 to the electrically conductive material filling the second through-hole 46 or to a metallized region surrounding the via. A second conductor 100 electrically connects the second lead 72 of the monitor diode 70 to the electrically conductive material filling the third through-hole 45 or to a metallized region surrounding the via.

The holder 50 needs to be solderable and weldable, as well as having a coefficient of thermal expansion similar to the coefficient of thermal expansion of the non-electrically conductive substrate 40 which is a ceramic material. Such materials include FeNi and FeNiCo. Specifically, a material having twenty-nine percent Ni, seventeen percent Co, and the balance Fe trades under the name KOVAR, the name is owned by Carpenter Technology Corporation. The flex connector 60 has a base substrate made of a flexible insulating material such as KAPTON and on which electrically conductive traces are laid. Non-electrically conductive substrate 40 is made of a ceramic material such as alumina, AIN or BeO. The electrically conductive plating material is typically made of a mixture of glass, palladium, and silver which is mixed together, applied to the ceramic material, and heated to a molten state and allowed to solidify. The glass component of the mixture fuses with the base ceramic material of the non-electrically conductive substrate 40. The palladium/silver component of the mixture provides for the electrical conductivity of the plating. The electrically conductive can 30 is typically made of an alloy, such as KOVAR, which has a coefficient of thermal expansion similar to the coefficient of thermal expansion for both the non-electrically conductive substrate 40 which is ceramic and the transparent element 20 which is glass. The electrically conductive can 30 is attached to the electrically conductive plating material adhered to the third region 41 of the non-electrically conductive substrate 40 in order to form a hermetic barrier. The electrically conductive can 30 is attached to the non-electrically conductive substrate 40, preferably, by a soldering process or by a brazing process.

The transparent element 20 is made of glass or sapphire. The conductors 90, 100 are substantially made of gold and are affixed to the vias 45a, 46a and to the leads 72, 82 by way of a gold bond technique where the gold conductor touches the lead, which is held at a temperature above ambient, or via and is vibrated. An exposed surface of the vias may have a secondary plating of gold to enhance wire bond adhesion. During the wire bond process, the vibrations and the elevated temperature cause the gold conductor to adhere to the lead. One such method of wire bonding is disclosed in U.S. Pat. No. 5,938,952 which is hereby incorporated herein by reference.

The unique combination of materials and arrangement of components allows the width dimension W to be 3.25 millimeters or less. The optical axis 86 is positioned midway along the width dimension W. As compared to the device 200 of the related art shown in FIG. 8, the device 10 of FIG. 1 is compact. The non-electrically conductive substrate 40 has electrically conductive vias 44a, 45a, and 46a, and electrically conductive regions 41 and 43, which forms an unique electrical circuit arrangement based on geometry and material selection. The non-electrically conductive substrate 40 also has a unique shape which is rectangular or square. The shape and materials of construction allow two or more of the devices 10 to be placed together, and eliminate the wasted area present on the device 200 of FIG. 8.

Figure 7:
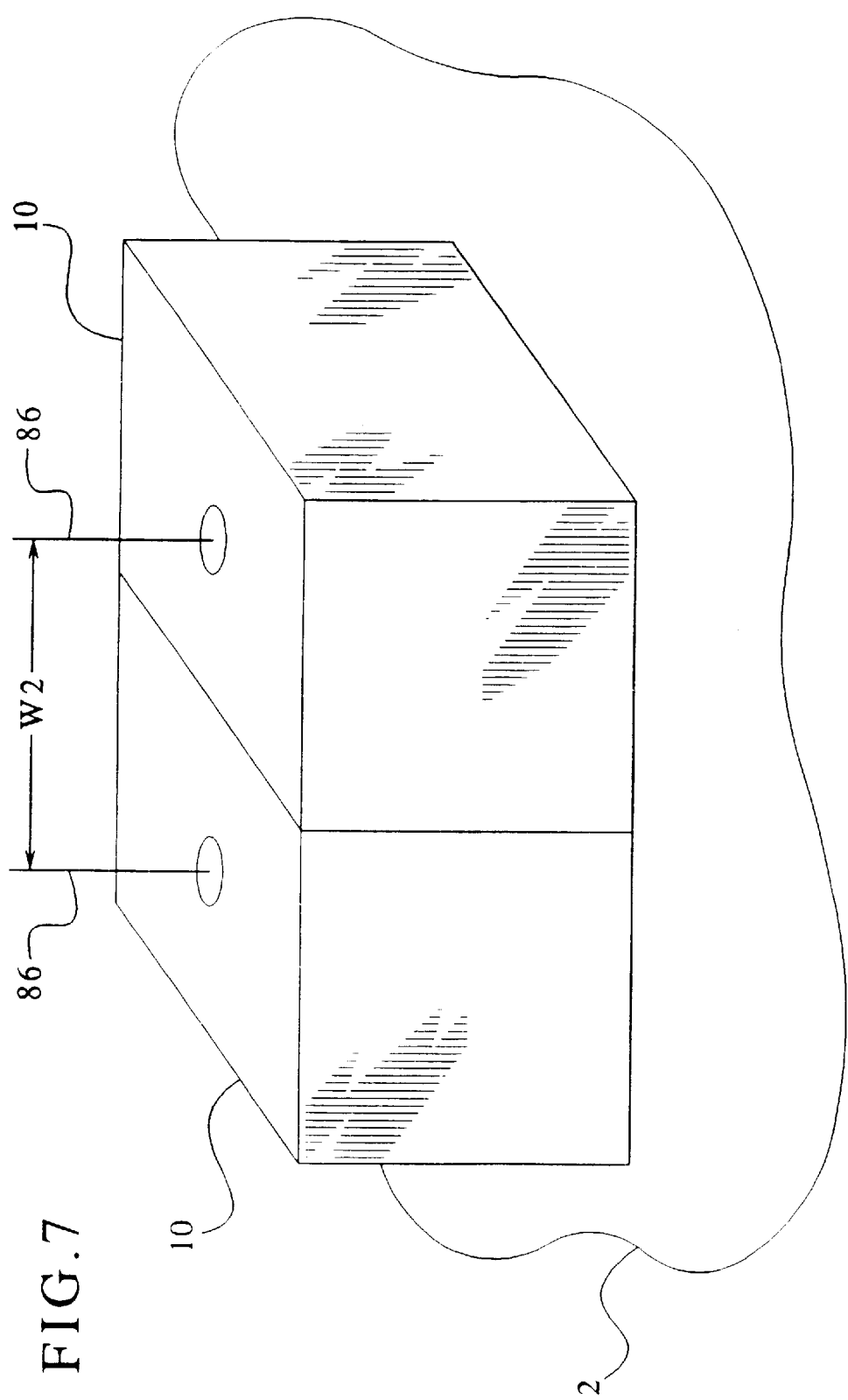
FIG. 7 is a perspective view of two optoelectronic packages positioned side-by-side on a planar surface.
Figure 8:
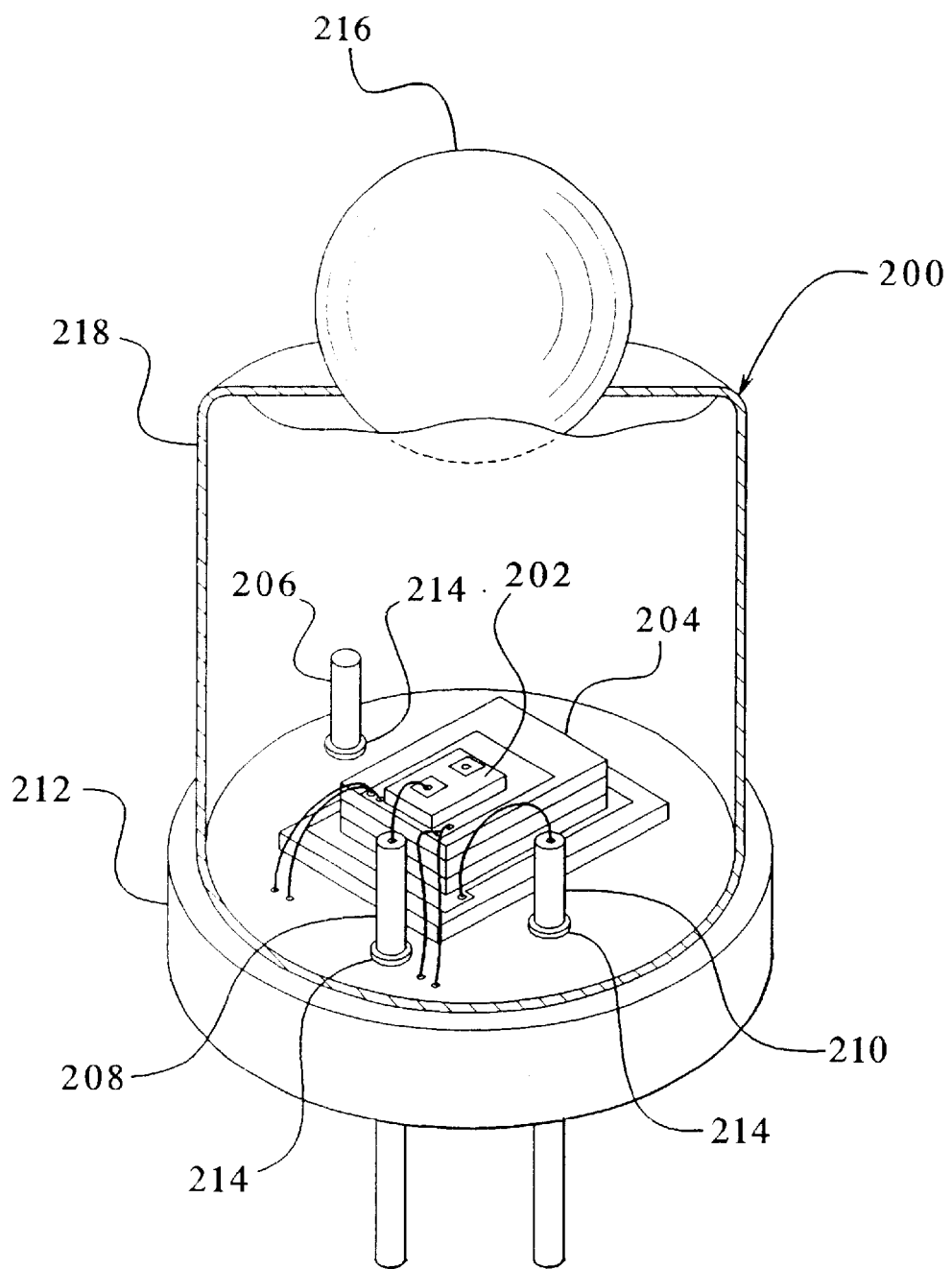
FIG. 8 is a partial cross-sectional perspective view of a related optoelectronic package.

The structure of the small format optoelectronic package or device 10 allows for two of the devices 10, 10 to be placed on the same plane 2 adjacent to each other, as shown in FIG. 7. In such an arrangement, the optical axis 86 of each device 10 are separated by a distance, W2. The distance, W2, is 3.25 millimeters or less.

Figure 4:
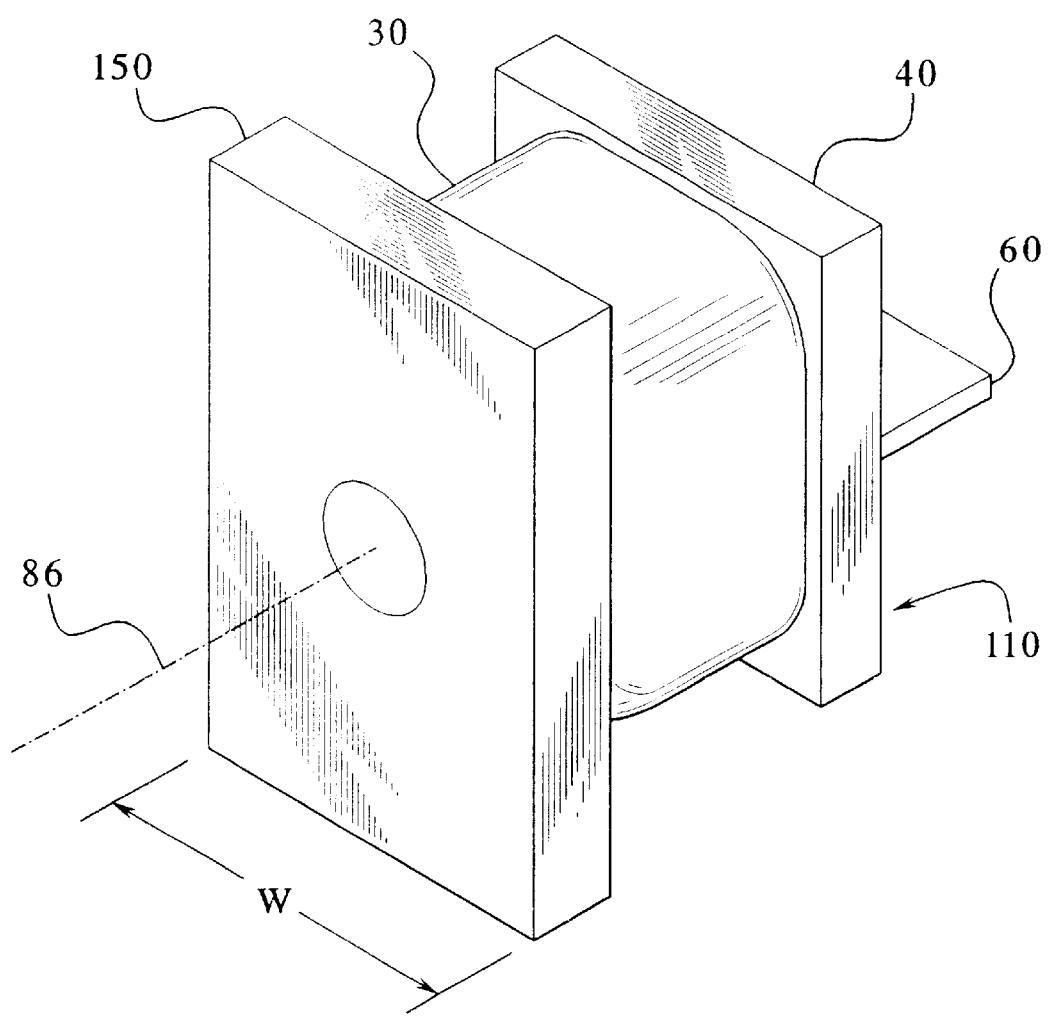
FIG. 4 is a perspective view of a second embodiment of the optoelectronic package.
Figure 5:
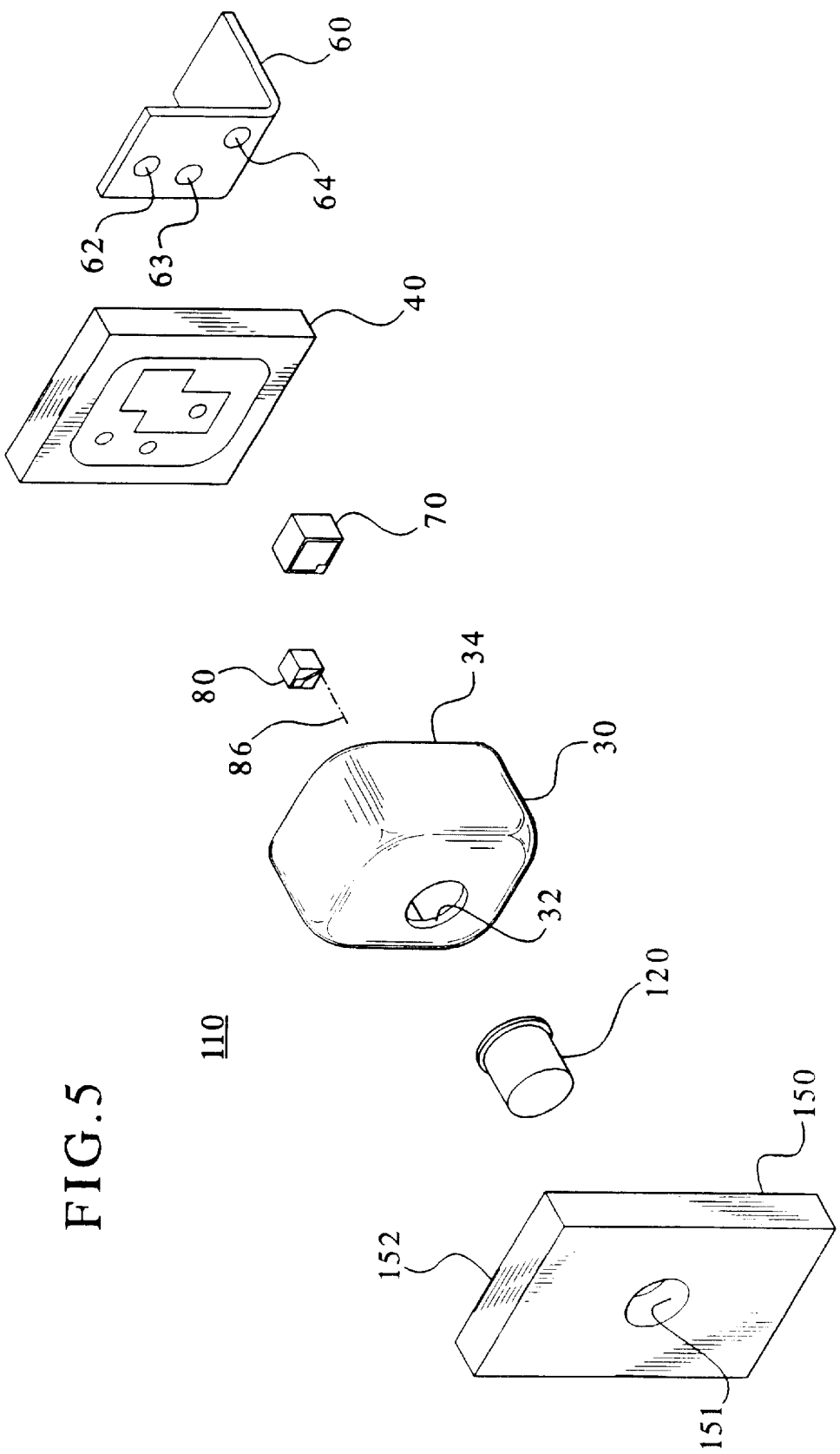
FIG. 5 is an exploded perspective view of the optoelectronic package of FIG. 4.
Figure 6:
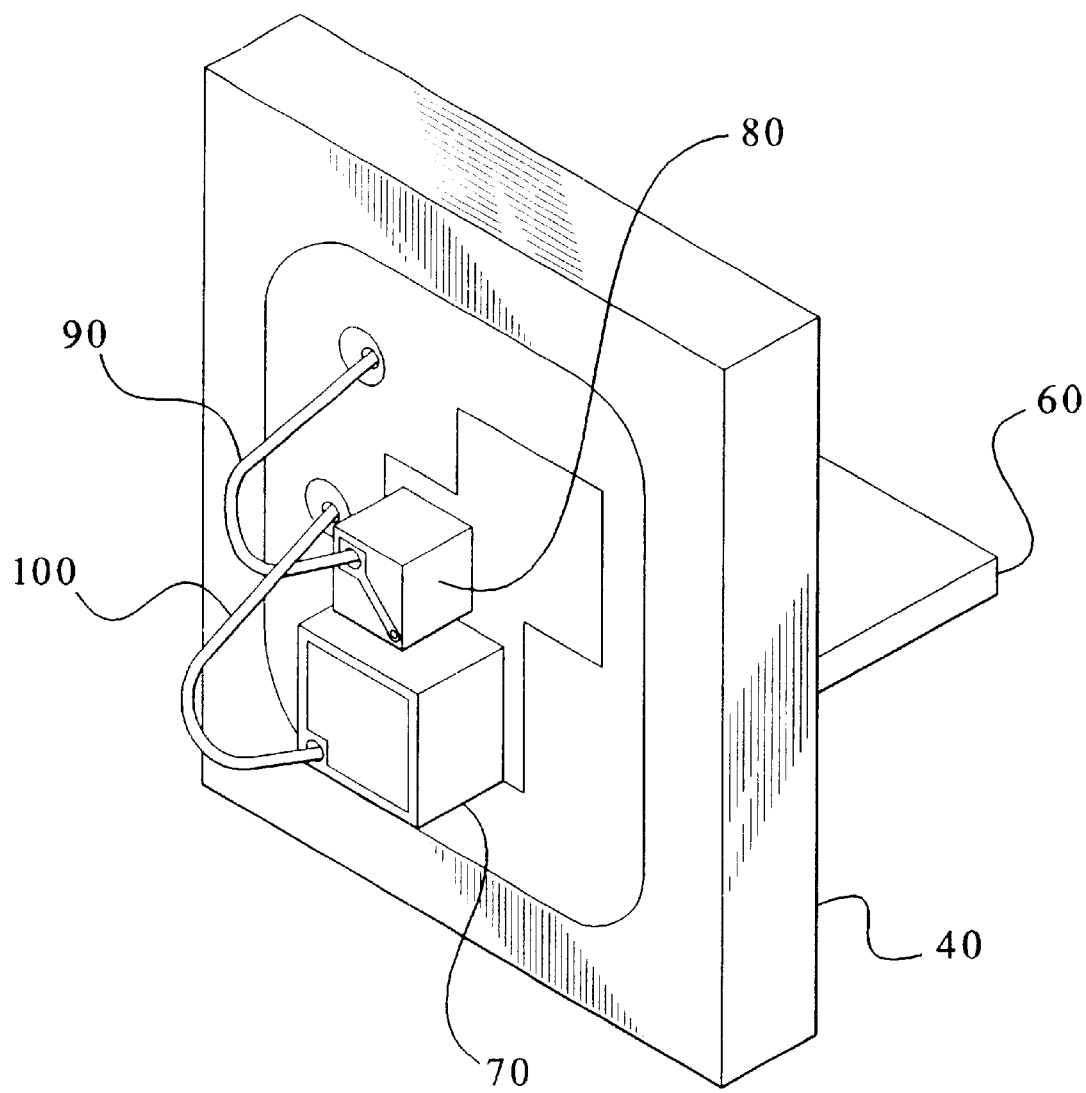
FIG. 6 is a perspective view of the monitor diode, optical diode, base substrate, and flex connector of the optoelectronic package of FIG. 4.

FIGS. 4–6 show a second version of the small format optoelectronic package or device 110. The device 110 includes many of the same components as does the device 10. The device 110 includes the optical diode 80, the monitor diode 70, the non-electrically conductive substrate 40, the flex connector 60, the electrically conductive can 30, and first and second conductors 90, 100. Since the listed components are the same as previously discussed in regard to device 10 they are not discussed further in the discussion of the embodiment of device 110.

In FIG. 5, a transparent element 120 is mounted on and sealed to the first aperture 32 of the electrically conductive can 30. A holder 150 has an aperture 151 and a surface 152. The aperture 151 receives the transparent element 120. The surface 152 of the holder 150 is brazed or welded to the electrically conductive can 30. The device 110 can be mounted within another housing by way of the holder 150 from a location of the electrically conductive can 30 which is different than the device 10. The materials of construction are similar to those discussed in regard to the device 10.

Figure 9:
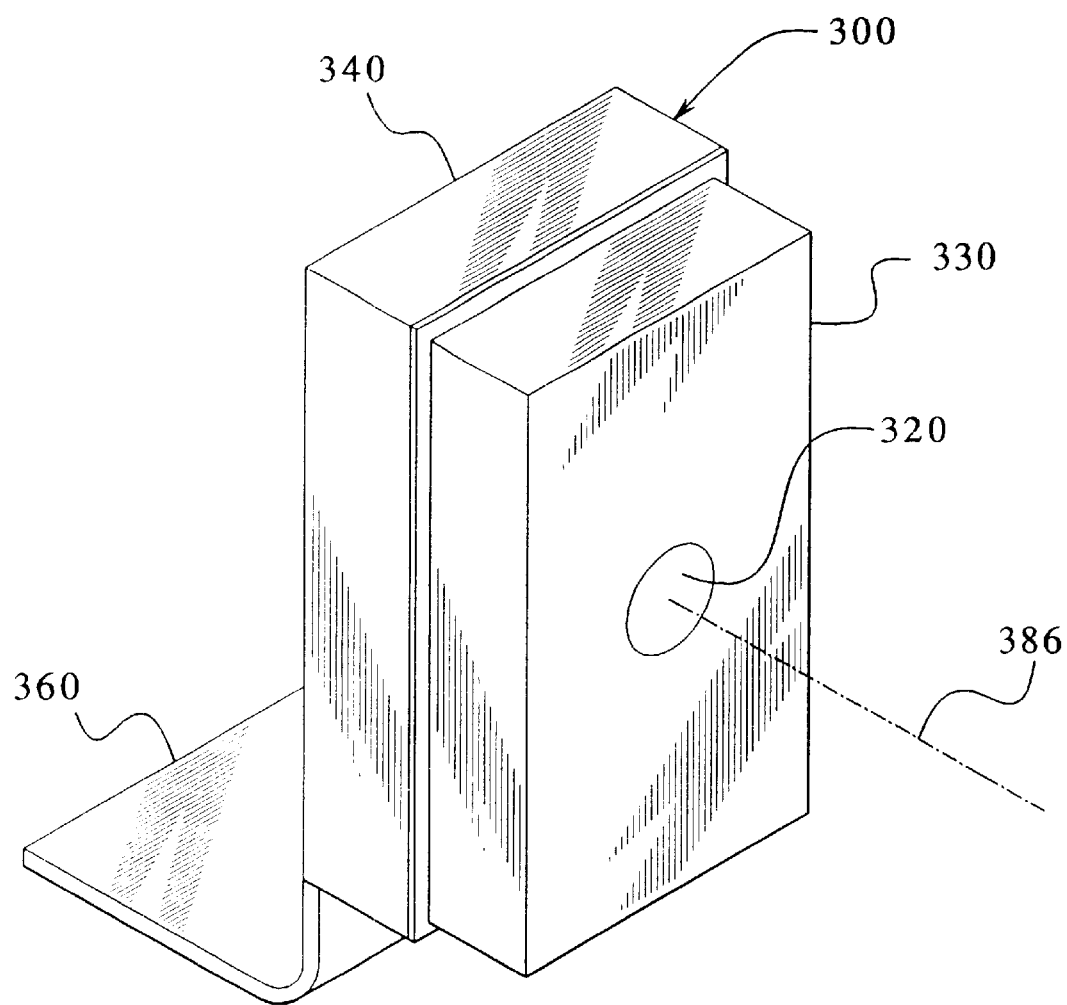
FIG. 9 is a perspective view of an optoelectronic package having a can manufactured by a machining process or a powder metallurgy process.

A first embodiment is shown in FIGS. 9–12. FIG. 9 is a perspective view of the optoelectronic package 300 which shows a transparent element 320 mounted in an electrically conductive can 330, where the electrically conductive can 330 is mounted on and sealed to an electrically conductive plating adhered to a non-electrically conductive substrate 340. Attached to the non-electrically conductive substrate 340 is a flex connector 360. An optical axis 386 is shown projecting through the transparent element 320.

The can 330 is either machined or made by a powder metallurgy process or a stamping/coining process or a cold-forming process. In this embodiment, the can 330 has a low profile as compared to can 30 shown in FIG. 1 which is manufactured by a drawing process. Machining and forming processes are well understood by those skilled in the art and are not further discussed. The powder metallurgy process includes powder metal sintering, and powder metal forging both of which are well understood by those skilled in the art and are not further discussed.

Figure 10:
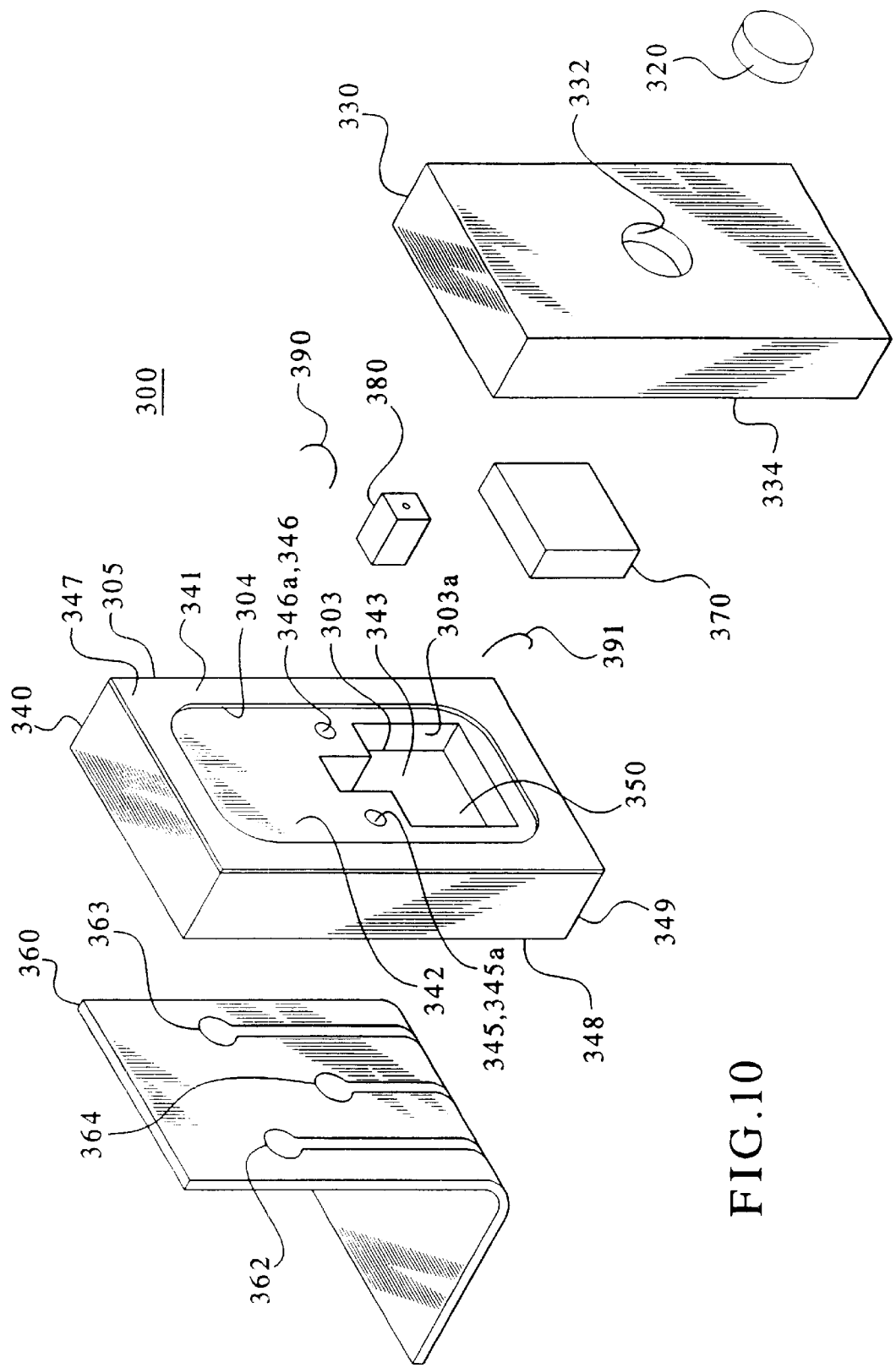
FIG. 10 is an exploded perspective view of the optoelectronic package of FIG. 9.

FIG. 10 is an exploded perspective view of the device 300 shown in FIG. 9. The electrically conductive can 330 has a first aperture 332. The transparent element is mounted on and hermetically sealed to the first aperture 332. The non-electrically conductive substrate 340 has a first surface 347 and a second surface 348 separated by a thickness as identified along edge 349. The first surface 347 is divided into three regions. The regions include a first region 343, a second region 342, and a third region 341. The first region 343 is separated from the third region 341 by the second region 342. The first region 343 is bound by line 303. The second region 342 is bound by lines 303a and 304. The third region 341 is bound by lines 304 and 305. The first region 343 is located in a depressed space 350 as compared to the second and third regions 342, 341. An optical emitting element such as a VCSEL or detector such as a PIN diode 380 and a monitor diode 370 are mounted within the depressed space 350.

The non-electrically conductive substrate 340 includes three through-holes. The three through-holes include the first through-hole 344 (see FIG. 12), a second through-hole 346, and a third through-hole 345. An electrically conductive plating or coating is adhered to the first surface 347 of the non-electrically conductive substrate 340 in the first region 343 and in the third region 341. Furthermore, the first, second, and third through-holes 344, 346, 345, are filled with the electrically conductive material so as to form first, second, and third conductive vias 344a, 346a, and 345a, respectively, which hermetically seal the through-holes.

The can 330 is hermetically sealed to the conductive plating occupying the third region 341 along a second aperture 334 of the can 330. The flex connector 360 has conductive traces 362, 363, and 364. Conductive trace 362 is electrically connected to conductive via 345a, conductive trace 364 is electrically connected to conductive via 344a, and conductive trace 363 is electrically connected to conductive via 346a.

Figure 11:
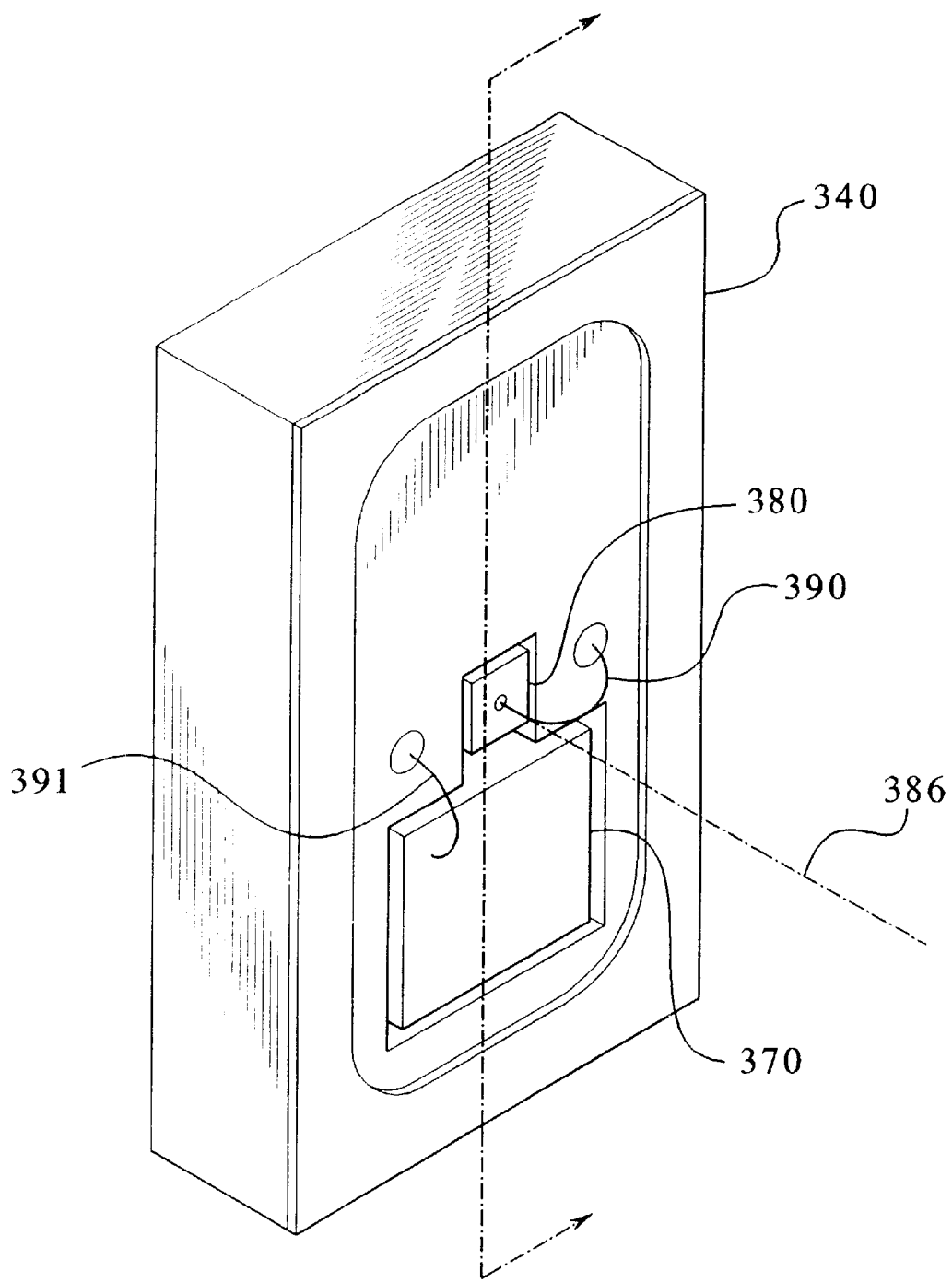
FIG. 11 is a perspective view of the optoelectronic package of FIG. 9 with the can removed.

FIG. 11 is a perspective view of the non-electrically conductive substrate 340 having the optical diode 380 and the monitor diode 370 mounted in the depressed space 350. Wire bond 390 electrically connects the optical diode 380 to the second via 346a. Wire bond 391 electrically connects the monitor diode 370 to the third via 345a. FIG. 11 shows that the exposed surfaces of the optical diode 380 and the monitor diode 370 are substantially flush or exist in the same plane as do the second and third regions 342, 341 of the first surface 347.

Figure 12:
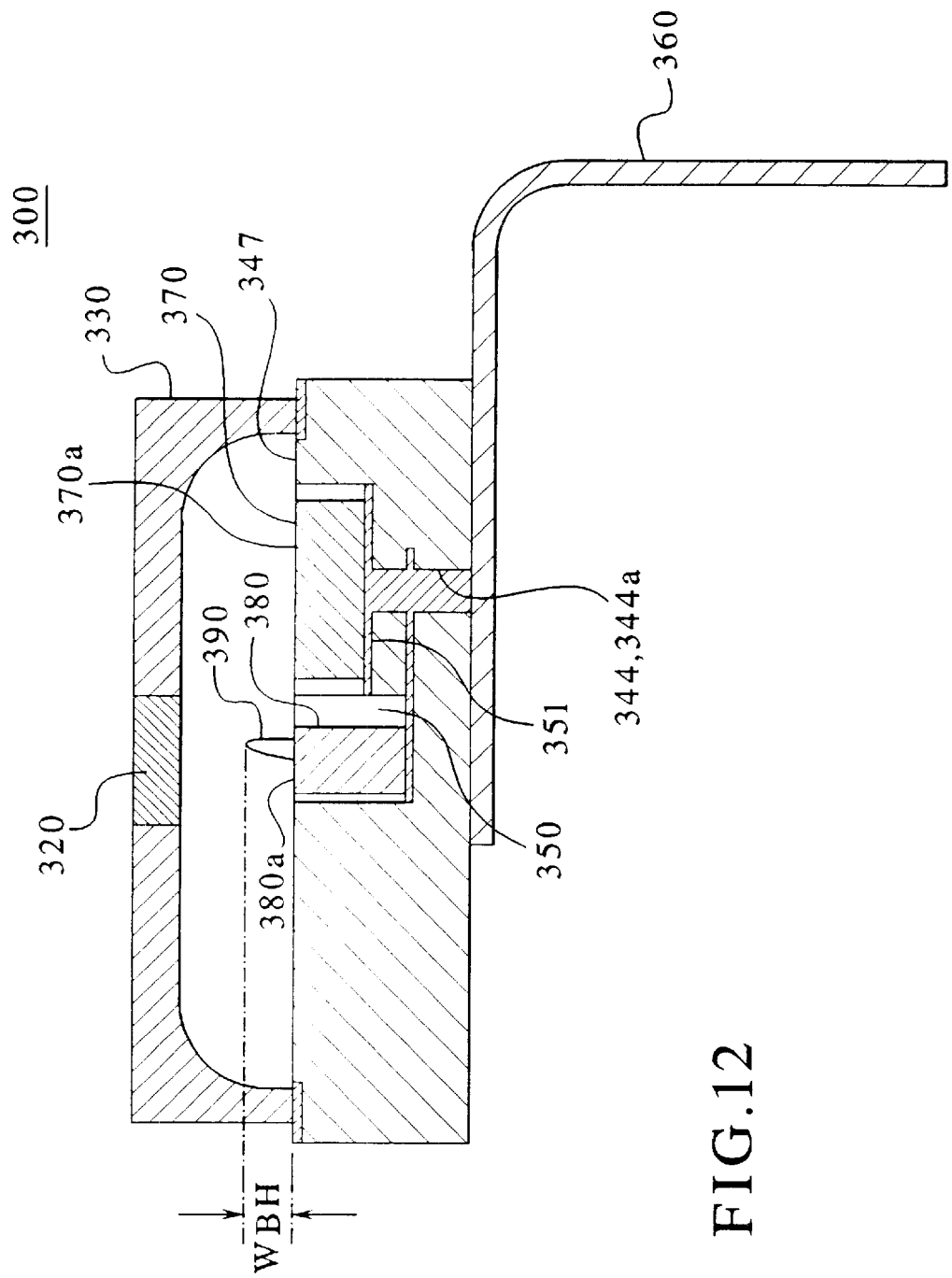
FIG. 12 is a cross-sectional view of the optoelectronic package of FIG. 9 taken along section line 11—11 of FIG. 11.

FIG. 12 is a cross-sectional view of the device 300 of FIG. 9 taken along section line 12—12 of FIG. 11. FIG. 12 shows the height of the wire bond as dimension WBH. Furthermore, the depressed space 350 is shown to have multiple levels so as to substantially make co-planar surfaces 380a, 370a of the optical diode 380, the monitor diode 370, respectively, and the second and third regions 342, 341, of the first surface 347. The optical diode 380 and the monitor diode 370 are electrically connected to the first region 343. A horizontal conductor 351 electrically connects the optical diode 380 to the electrically conductive via 344a. The wire bond height WBH needs to be high enough so that the wire bond attachment points should be as nearly normal to the attachment surface as possible while observing a minimum bend radius rule so as to reduce stress. Thus, the wire bond height WBH is minimized when all of the attachment points of the wire bond occur on the same plane. The wire bond height determines the height of the can 330. If the wire bond height is small then the height of the can 330 is small. The device 300 as shown in FIGS. 9–12 presents such an embodiment.

Figure 13:
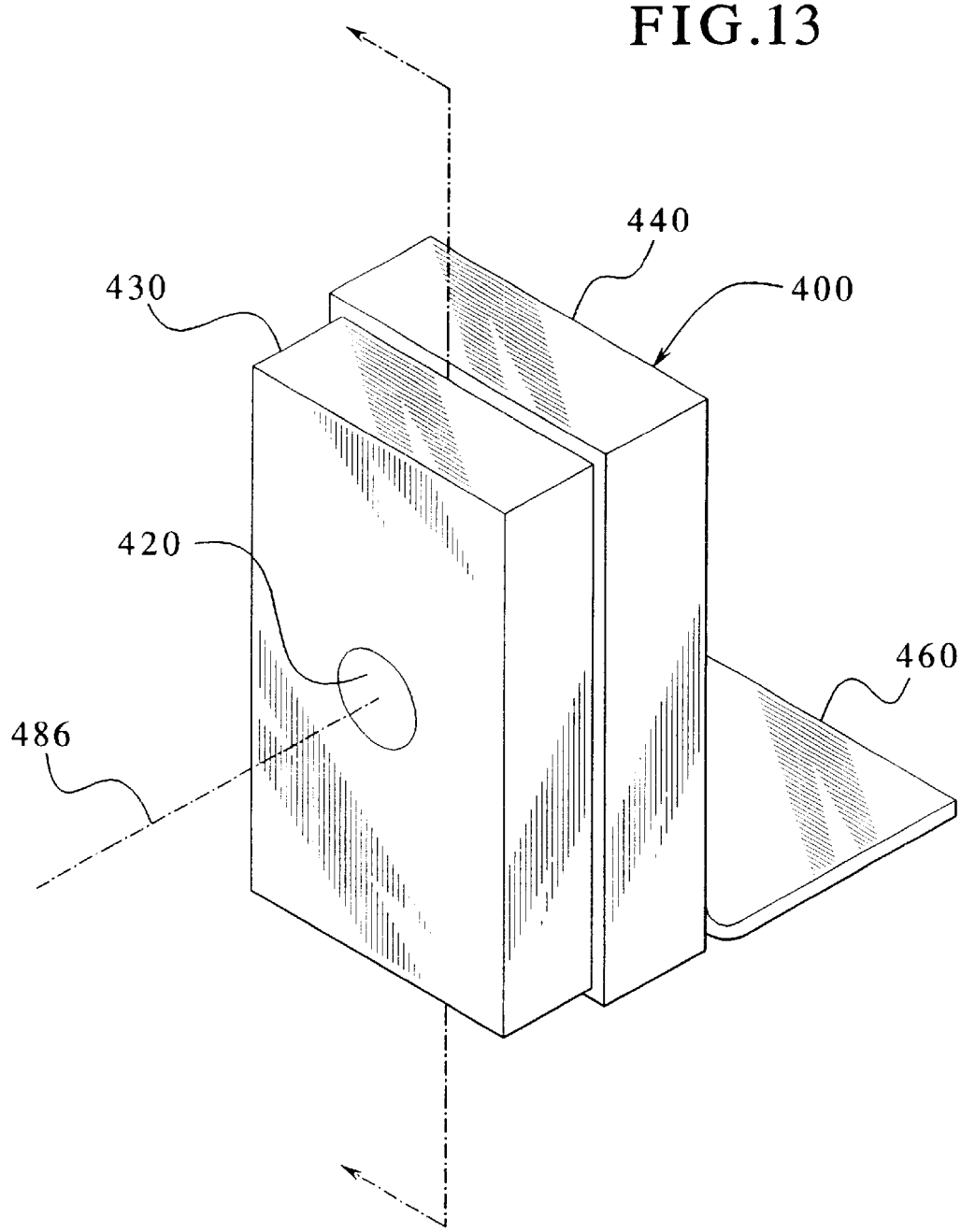
FIG. 13 is a perspective view of another optoelectronic package.
Figure 14:
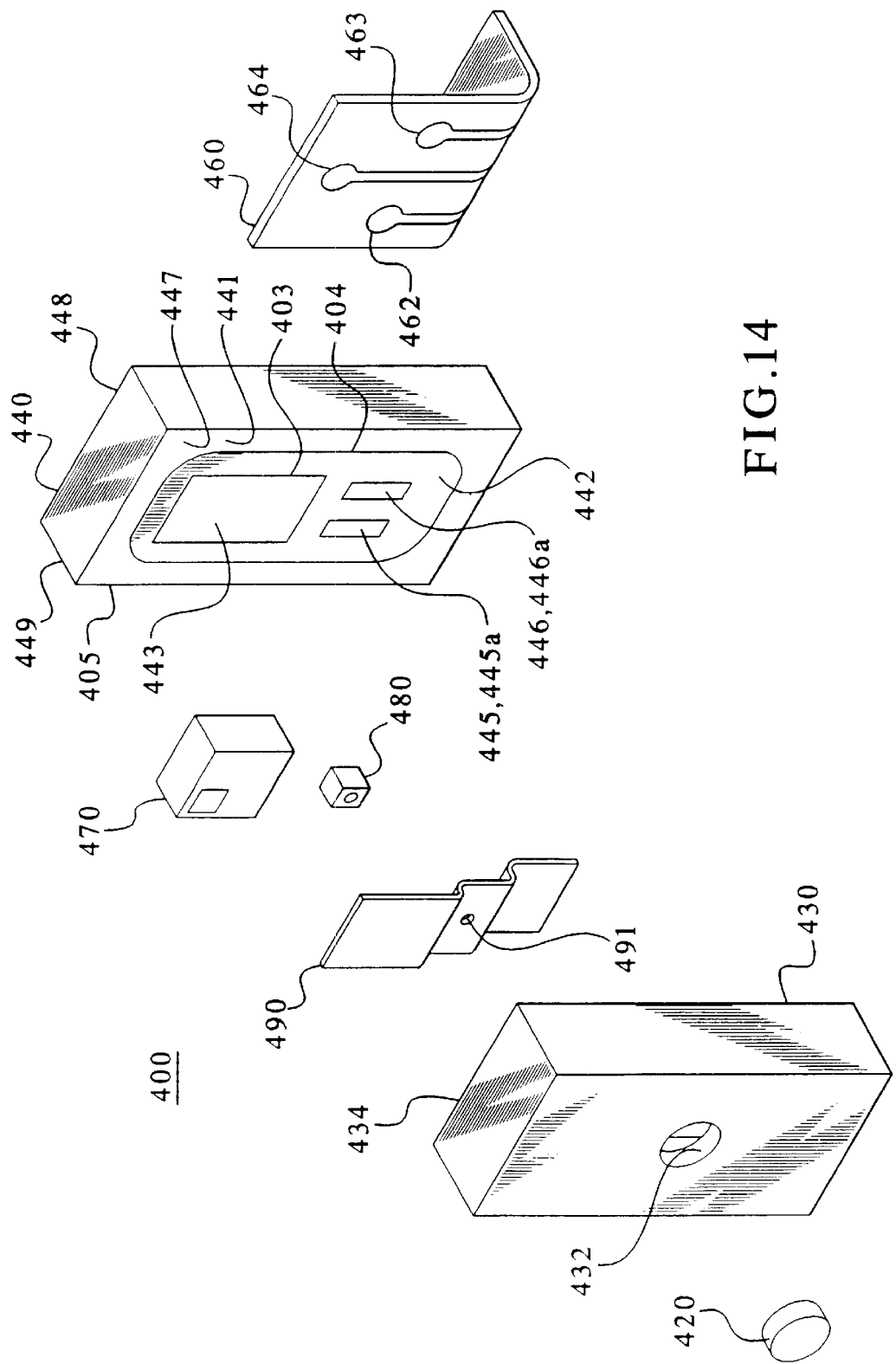
FIG. 14 is an exploded perspective view of the optoelectronic package of FIG. 13.
Figure 15:
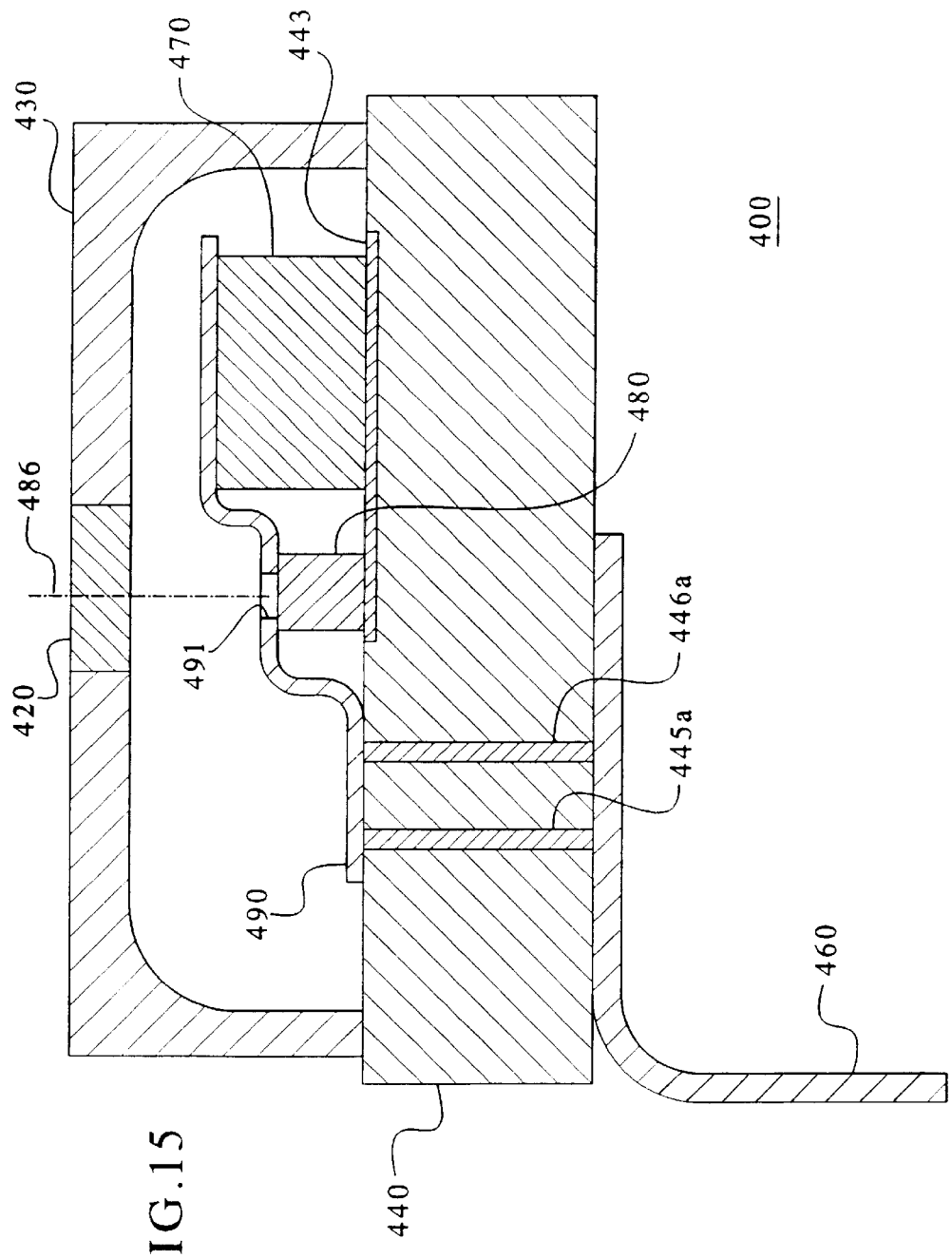
FIG. 15 is a cross-sectional view of the optoelectronic package of FIG. 13.

A second embodiment is shown in FIGS. 13–15. FIG. 13 is a perspective view of the optoelectronic package or device 400 which shows a transparent element 420 mounted in an electrically conductive can 430, where the electrically conductive can 430 is mounted on and hermetically sealed to an electrically conductive plating adhered to a non-electrically conductive substrate 440. Attached to the non-electrically conductive substrate 440 is a flex connector 460. An optical axis 486 is shown projecting through the transparent element 420. The can 430 is constructed similarly to the can 330 of the first embodiment.

FIG. 14 is an exploded perspective view of the device 400 shown in FIG. 13. The electrically conductive can 430 has a first aperture 432. The transparent element 420 is mounted on and hermetically sealed to the first aperture 432. The non-electrically conductive substrate 440 has a first surface 447 and a second surface 448 separated by a thickness as identified along edge 449. The first surface 447 is divided into three regions. The regions include a first region 443, a second region 442, and a third region 441. The first region 443 is separated from the third region 441 by the second region 442. The first region 443 is bound by line 403. The second region 442 is bound by lines 403 and 404. The third region 441 is bound by lines 404 and 405.

The non-electrically conductive substrate 440 includes three through-holes. The three through-holes include a first through-hole (not shown), a second through-hole 446, and a third through-hole 445. An electrically conductive plating or coating is adhered to the first surface 447 of the non-electrically conductive substrate 440 in the first region 443 and in the third region 441. Furthermore, the first, second, and third through-holes 444, 446, 445, are filled with the electrically conductive material so as to form first, second, and third conductive vias 444a (not shown), 446a, and 445a, respectively, which hermetically seal the through-holes.

The can 430 is hermetically sealed to the conductive plating adhered to the third region 441 along a second aperture 434 of the can 430. The flex connector 460 has conductive traces 462, 463, and 464. Conductive trace 462 is electrically connected to conductive via 445a, conductive trace 464 is electrically connected to conductive via 444a (not shown), and conductive trace 463 is electrically connected to conductive via 446a. The optical diode 480 and the monitor diode 470 are electrically connected to the electrically conductive plating adhered to the third region 443.

A second flex connector 490 has two conductive traces (not shown). The first conductive trace of the second flex connector 490 electrically connects the third conductive via to the optical diode 480. The second conductive trace of the second flex connector 490 electrically connects the second conductive via 446a to the monitor diode 470. The second flex connector 490 can be mounted to the vias and the diodes by way of a conductive epoxy or solder. The second flex connector 490 has an aperture 491 through which the optical axis 486 passes.

FIG. 15 is a cross-sectional view of the device 400 taken along section line 15—15 as shown in FIG. 13. Please note that the section line 15—15 does jog so as to cut through vias 445a and 446a, however, the section line 15—15 does not jog so as to cut through via 444a. The second flex connector 490 allows for a small profile or height of the can 430 which provides for a small profile device 400 as shown in FIGS. 13–15. The use of the second flex connector 490 eliminates the need to accommodate the space necessary for the service loop of the wire bond connectors 90, 91 as shown in FIG. 3. Furthermore, circuitry can be placed on the second flex connector 490 so as to control the impedance of the connection.

Figure 16:
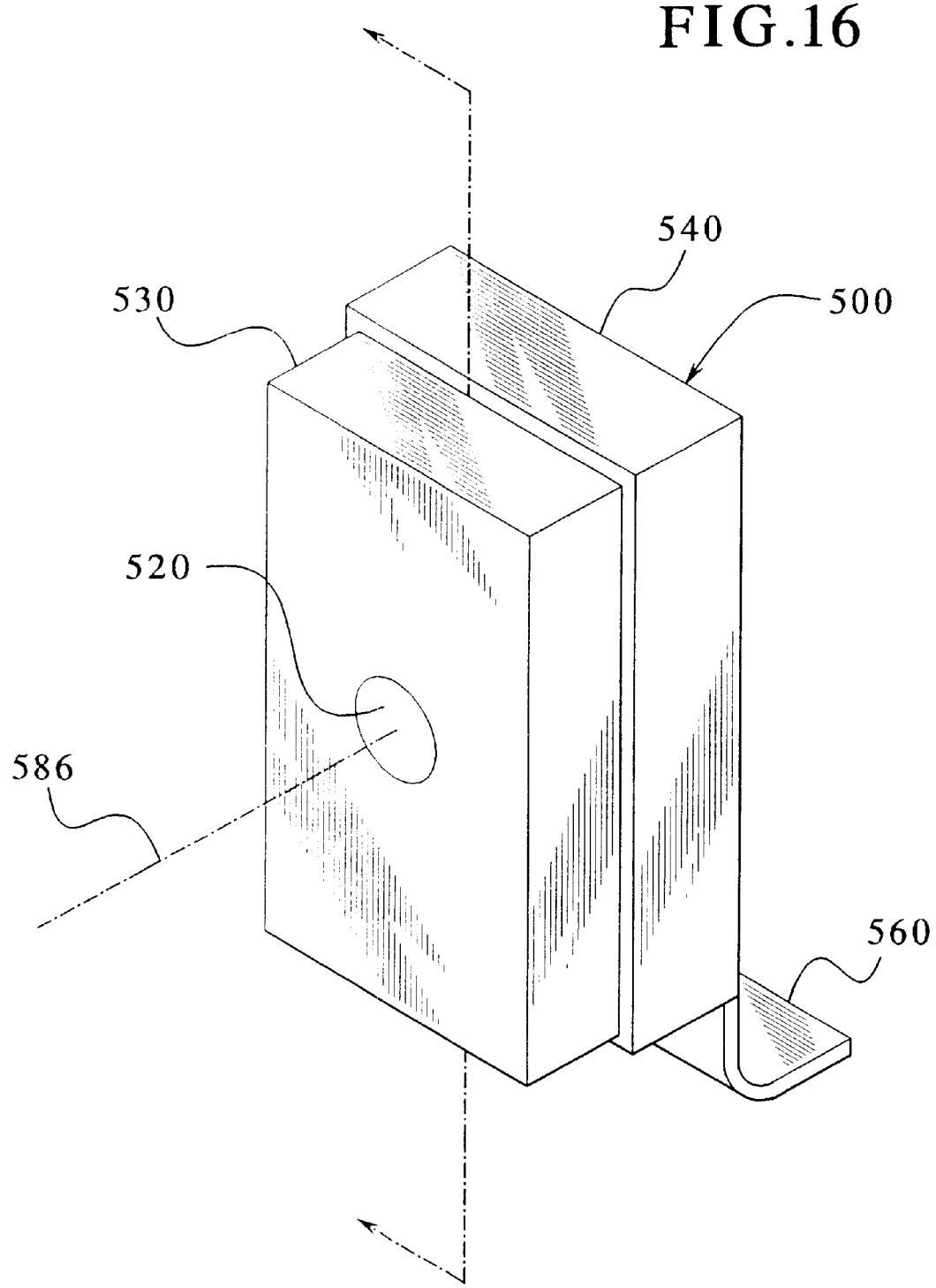
FIG. 16 is a perspective view of yet another optoelectronic package.
Figure 17:
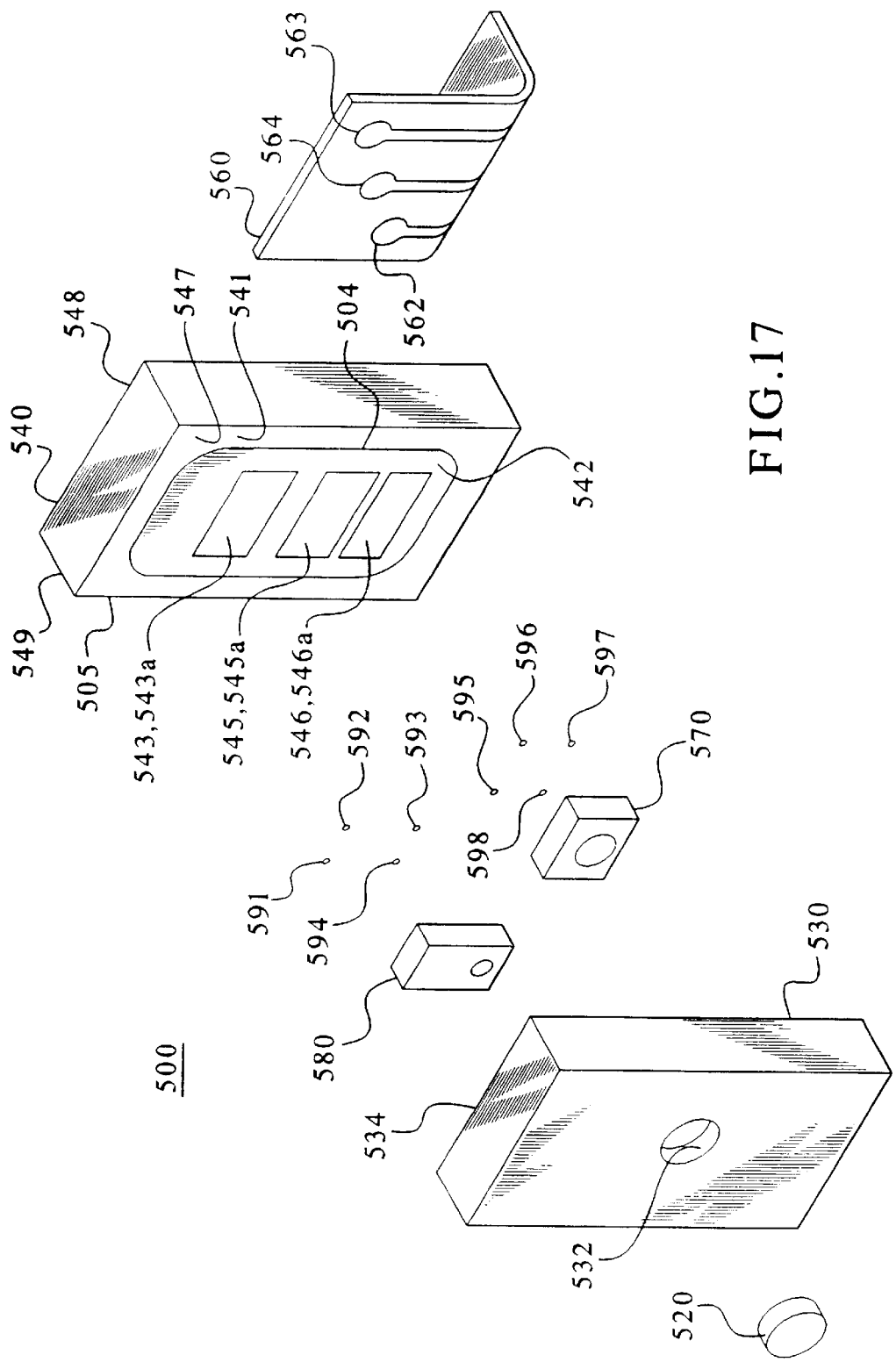
FIG. 17 is an exploded perspective view of the optoelectronic package of FIG. 16.
Figure 18:
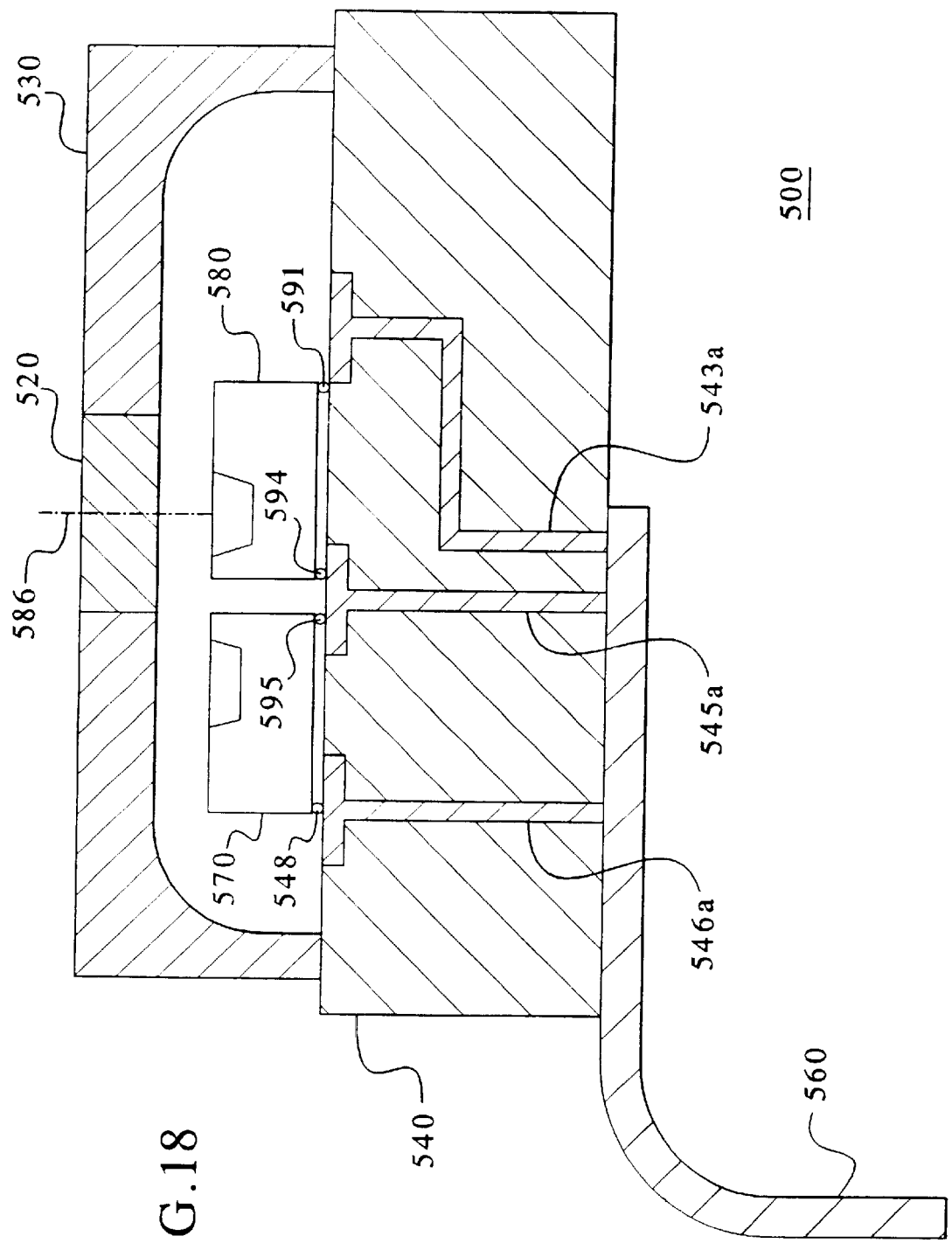
FIG. 18 is a cross-sectional view of the optoelectronic package of FIG. 16.

A third embodiment is shown in FIGS. 16–18. FIG. 16 is a perspective view of the optoelectronic package or device 500 which shows a transparent element 520 mounted in an electrically conductive can 530, where the electrically conductive can 530 is mounted on and hermetically sealed to an electrically conductive plating adhered to a non-electrically conductive substrate 540. Attached to the non-electrically conductive substrate 540 is a flex connector 560. An optical axis 586 is shown projecting through the transparent element 520. An optical signal is emitted by an optical diode 580. The optical signal travels in a direction of the optical axis 586. The can 530 is constructed similarly to the can 330 of the first embodiment.

FIG. 17 is an exploded perspective view of the device 500 shown in FIG. 16. The electrically conductive can 530 has a first aperture 532. The transparent element 520 is mounted on and hermetically sealed to the first aperture 532. The non-electrically conductive substrate 540 has a first surface 547 and a second surface 548 separated by a thickness as identified along edge 549. The first surface 547 is divided into two regions. The regions include a first region 541 and a second region 542. The first region 541 is bound by lines 505 and 504. The second region is bound by line 504.

The non-electrically conductive substrate 540 includes three through-holes. The three through-holes include a first through hole 543, a second through-hole 545, and a third through-hole 546. An electrically conductive plating or coating is adhered to the first surface 547 of the non-electrically conductive substrate 540 in the first region 541. Furthermore, the first, second, and third through-holes 543, 545, 546, are filled with the electrically conductive material so as to form first, second, and third conductive vias 543a, 545a, and 546a, respectively, which hermetically seal the through-holes.

The can 530 is hermetically sealed to the conductive plating adhered to first region 541 along a second aperture 534 of the can 530. The flex connector 560 has conductive traces 562, 563, 564. Conductive trace 562 is electrically connected to conductive via 546a, conductive trace 564 is electrically connected to conductive via 545a, and conductive trace 563 is electrically connected to conductive via 543a.

In this embodiment, the monitor diode 570 and the optical diode 580 are "flip-chip" designs where the diodes 570, 580 have their leads or contact positioned on only one side of the respective diode which are opposite to the optical signal reception or transmission side of the diodes. Such a photo diode is disclosed in U.S. Pat. No. 6,005,276 which is hereby incorporated herein by reference. The contacts are then electrically connected to the conductive vias by way of solder balls. The solder balls are reflowed and an attachment is made between the vias and the diodes. Solder balls or bumps are disclosed in U.S. Pat. No. 5,909,524 which is hereby incorporated herein by reference. Such an arrangement provides for a low profile since the wire bonds are eliminated.

The monitor diode 570 has a first lead or contact which is electrically connected to the third conductive via 546a by way of solder balls 597, 598. The monitor diode 570 has a second lead or contact which is electrically connected to the second conductive via 545*a* by way of solder balls 595, 596. The optical emitting or receiving diode 580 has a first lead or contact which is electrically connected to the second via 546*a* by way of solder balls 593, 594. The optical diode 580 has a second lead or contact which is electrically connected to the first conductive via 543*a* by way of solder balls 591, 592.

FIG. 18 is a cross-sectional view of the device 500 taken along section line 18—18 as shown in FIG. 16. Note that through-hole 543 and via 543*a* has a series of bends as it makes its way through the substrate.

Figure 19:
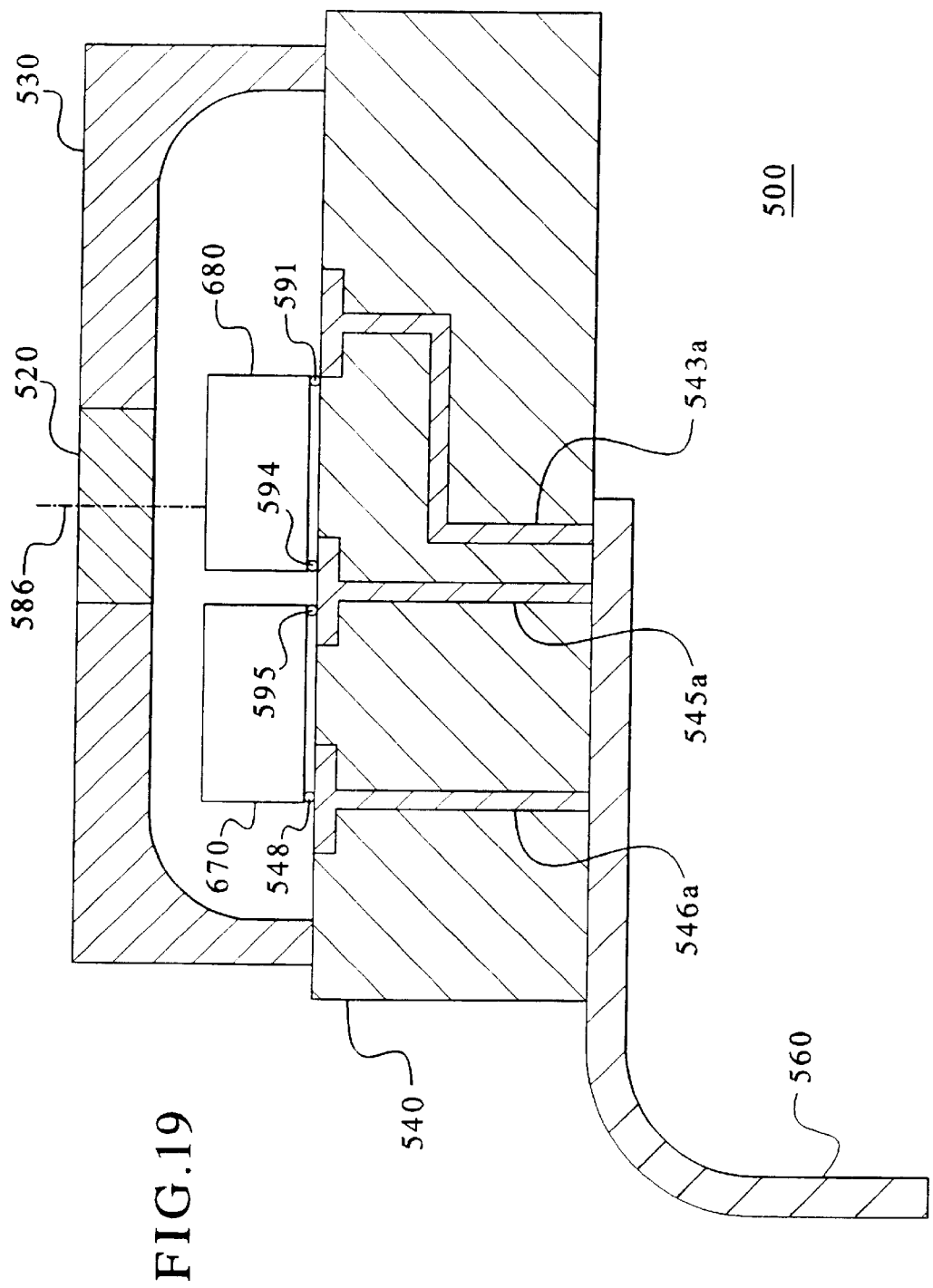
FIG. 19 is a cross-sectional view of an optoelectronic package which is similar to the package shown in FIG. 18.

FIG. 19 is a cross-sectional view of a device similar to that shown in FIG. 18. In one embodiment, element 670 is an amplifier and element 680 is a photodiode dector such as a PIN. In another embodiment, element 670 is a back illuminated photodiode and element 680 is a VCSEL.

In another embodiment, the holder and the electrically conductive can are made of a non-magnetic material such as a 300 series stainless steel. A can made of such a stainless steel material would have a thermally matched window material. Such a window material includes a thermally matched borosilicate glass. Elan Technology of Midway, Georgia, sells a thermally matched borosilicate glass material under the tradename ELAN #46.

In still yet another embodiment, a laser driver circuit, a PIN diode amplifier, or other signal conditioning electronic components are placed within the space defined by the non-electrically conductive substrate, the transparent element, and the electrically conductive can.

Obviously, numerous modifications and variations are possible in light of the above teachings. For example, the optical diode may be a detector photo diode or a laser such as a vertical cavity surface emitting laser (VCSEL) or a Fabry Perot device or a light emitting diode. Various features of the described configurations may be combined selectively in order to provide an optimum solution for each amplifier, PIN diode, VCSEL, and monitor diode in transmitting and receiving applications. Therefore, the present embodiments may provide a transmitting optical subassembly (TOSA) or a receiving optical subassembly (ROSA).

Briefly, Applicants have integrated the small format optoelectronic sub-assemblies discussed above into industrially applicable devices. The small format optoelectronic subassemblies, such as 300, 400, and 500, have been incorporated into a modular, high-density, multiple optical transmitter/receiver array 1300 as shown in FIGS. 20–39 and identified by numeral designator 1336. The small format optoelectronic subassemblies may or may not use flex connectors.

Figure 20:
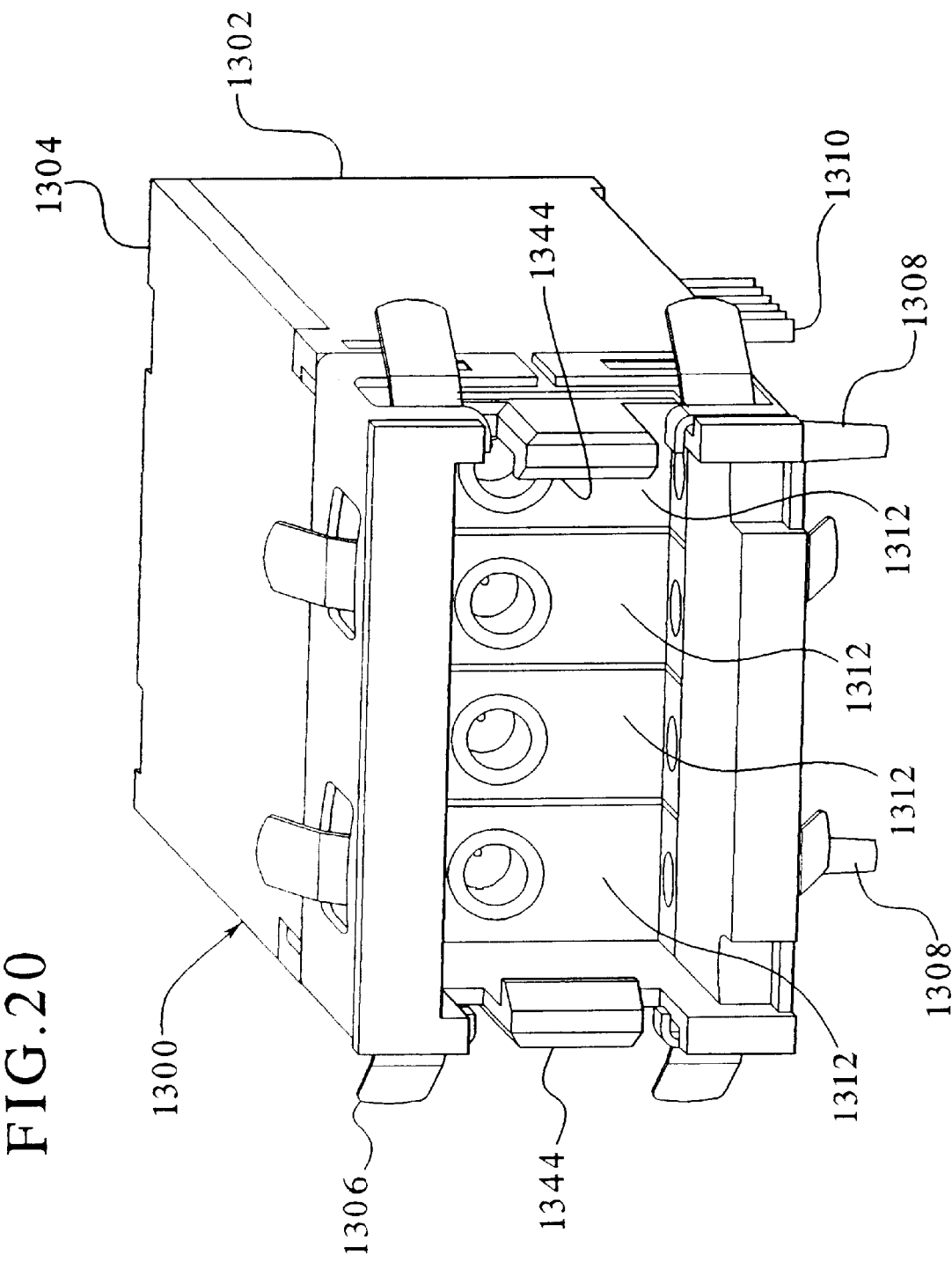
FIG. 20 is a perspective view of a modular, high-density, multiple optical transmitter/receiver array.

FIG. 20 is a perspective view of a modular, high-density, multiple optical transmitter/receiver array 1300. FIG. 20 further shows a housing 1302, a cover 1304, a ground clip 1306, and multiple one channel sub-assemblies 1312. Also shown are alignment pins 1308 and connection pins 1310 emanating from the housing 1302. Further shown are latches 1344 for connecting to a plug connector 1354 (see FIG. 33).

Figure 21:
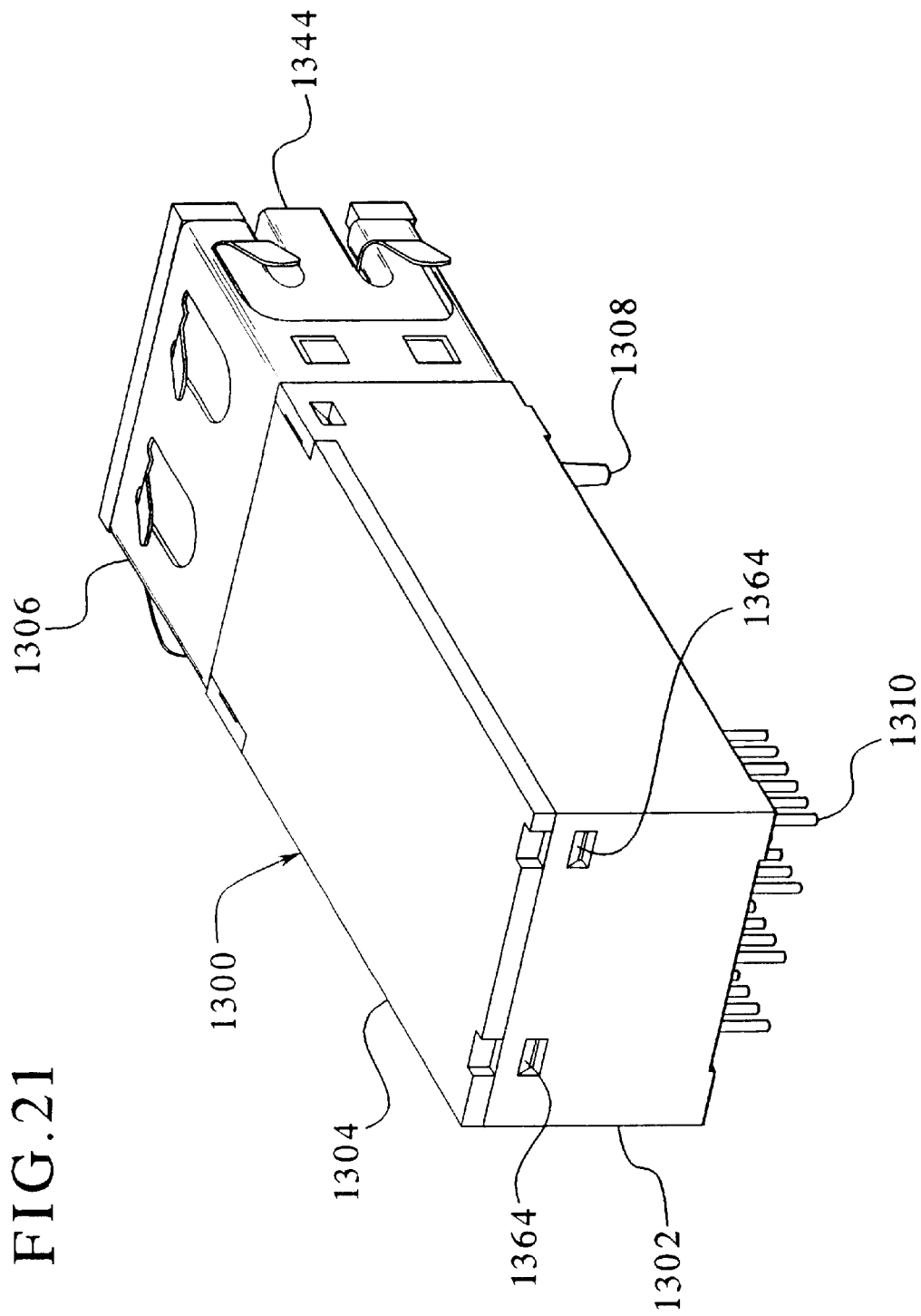
FIG. 21 is a perspective view of the modular, high-density, multiple optical transmitter/receiver array of FIG. 20 taken from another angle.

FIG. 21 is a perspective view of the modular high-density, multiple optical transmitter/receiver array 1300 of FIG. 20 taken from another angle. FIG. 21 further shows components displayed in FIG. 20, including the latches 1344, the ground clip 1306, the alignment pins 1308, the connection pins 1310, the cover 1304, and the housing 1302.

Figure 22:
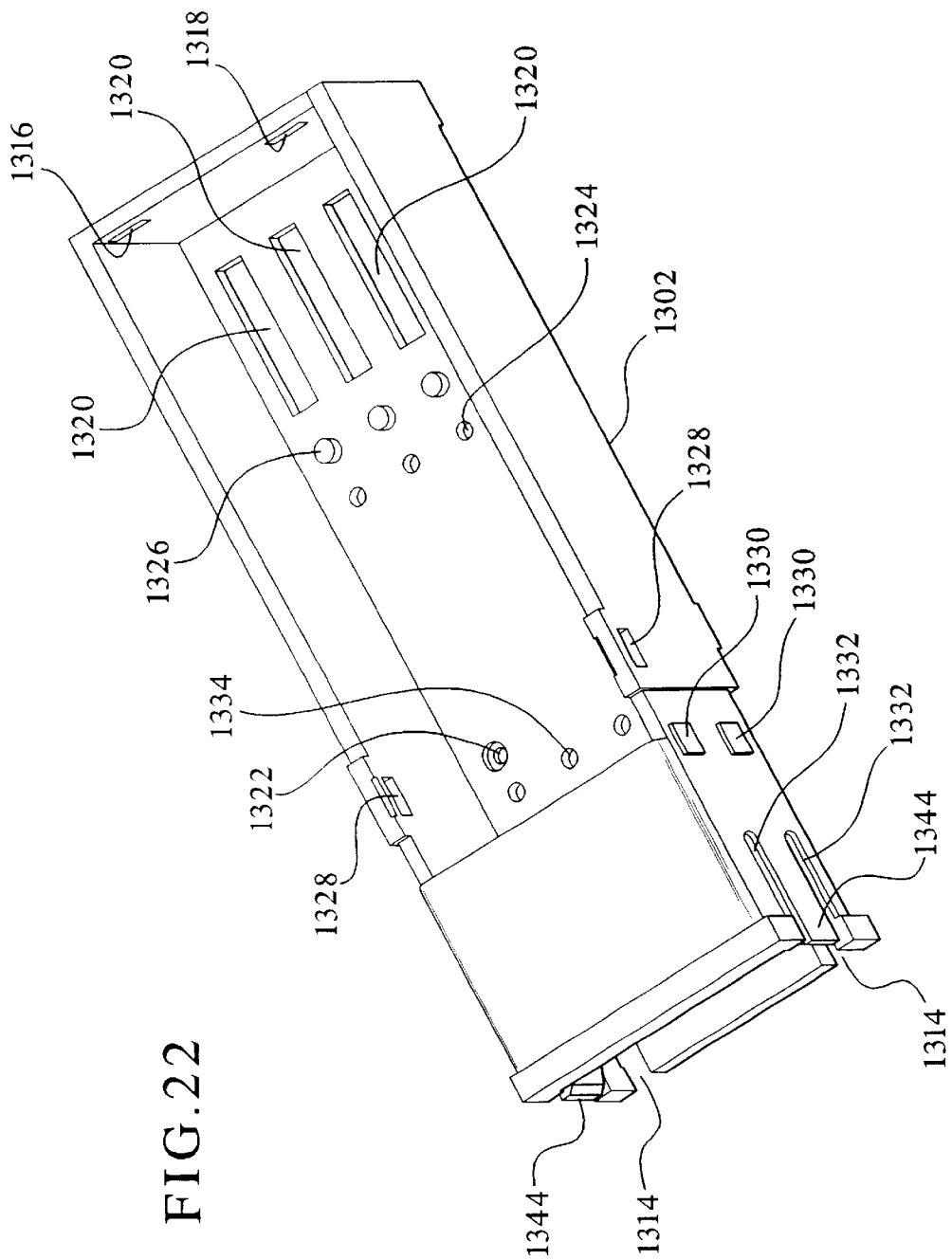
FIG. 22 is a perspective view of the housing of the modular, high-density, multiple optical transmitter/receiver array of FIG. 20.

FIG. 22 is a perspective view of the housing 1302 of the modular, high-density, multiple optical transmitter/receiver array 1300 of FIG. 20. FIG. 22 shows in great detail many features of the housing 1302. These features include back latch detents 1316, 1318, for accepting complementary components 1364 (see FIG. 21) of the cover 1304, cut-outs 1320 for allowing the connection pins 1310 to pass therethrough, alignment protrusions 1326 and 1357 (see FIG. 25) for aligning the one channel sub-assemblies 1312, alignment pin holes 1322 which are used to receive and hold the alignment pins 1308, push-out holes 1324, 1334 for accessing and pushing out an installed one channel sub-assembly 1312, and front latch detents 1328 for receiving complementary structure or features of the cover 1304. The housing 1302 further contains features for retaining the ground clip 1306. The ground clip features include ground clip protrusions 1330, and ground clip cut-outs 1332. These features help retain the ground clip 1306 on the array 1300. The housing 1302 further includes keying features 1314 for properly aligning a plug connector 1354 (see FIGS. 33 and 36) thereto. Also, latches 1344 are used to retain the plug connector 1354 therein.

Figure 23:
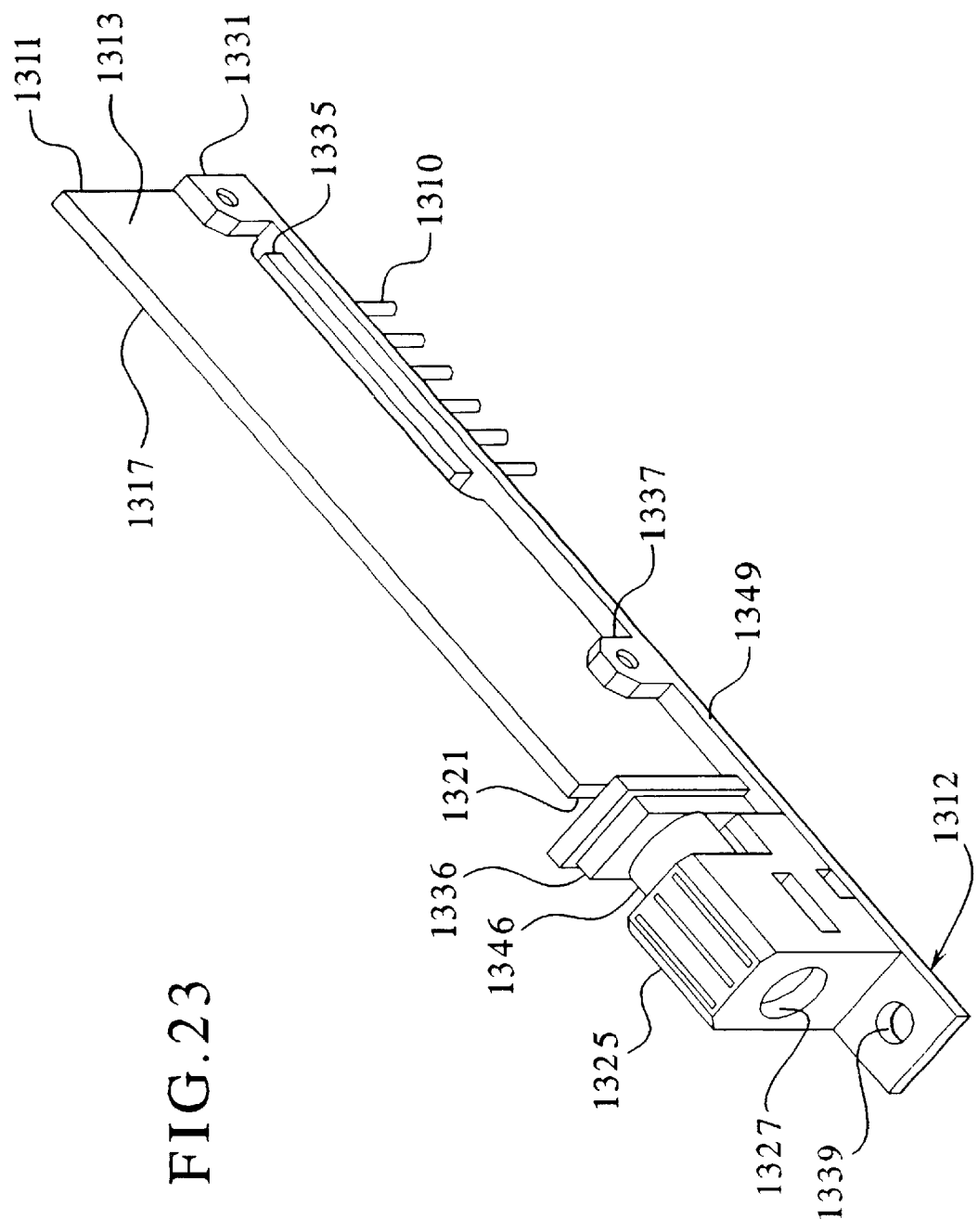
FIG. 23 is a perspective view of a single or one channel sub-assembly of the modular, high-density, multiple optical transmitter/receiver array.

FIG. 23 is a perspective view of a one channel sub-assembly 1312 of the modular, high-density, multiple optical transmitter/receiver array 1300. The one channel sub-assembly 1312 includes a base 1349, a connection pin header 1335, a circuit assembly or substrate 1311, a small format optical sub-assembly 1336, and an optical coupling element 1325. The base 1349 includes a front mounting clevis 1337, a rear mounting clevis 1331, and protrusion holes 1338 (see FIG. 24), 1339. The optical coupling element 1325 is mounted to the base 1349. The optical coupling element 1325 includes a ferrule receiving bore 1327 and a focusing element 1348 such as a spherical ball lens (see FIG. 28). Furthermore, the optical coupling element 1325 includes a metal ring or metal portion 1346 surrounding a portion of the optical coupling element 1325 which contains the ball lens 1348 (not shown). The small format optical sub-assembly 1336 has its cover laser welded to the metal ring 1346. The small format optical sub-assembly 1336 is laser welded to the metal ring 1346 in such a fashion so as to make approximately co-linear the axis of the ferrule receiving bore 1327 the ball lens 1348 and the transparent element of the small format optical sub-assembly 1336. Such alignment techniques are disclosed in U.S. Pat. No. 5,815,623.

The substrate 1311 mounts into the front and rear mounting devises 1337, 1331 and is retained there by way of pins 1340, 1342 passing therethrough. The substrate 1311 has an edge 1321. The substrate 1311 has conductive traces on side 1317 which electrically connect to contacts or leads of the small format optical sub-assembly 1336 when soldered at the junction of edge 1321 and the small format optical sub-assembly 1336. Side 1317 is known as the component side of the substrate 1311. The substrate 1311 has another side 1313 known as the conductive layer side. Furthermore, the component side 1317 of the substrate 1311 has additional traces which connect to the connection pins 1310 by way of solder.

Figure 24:
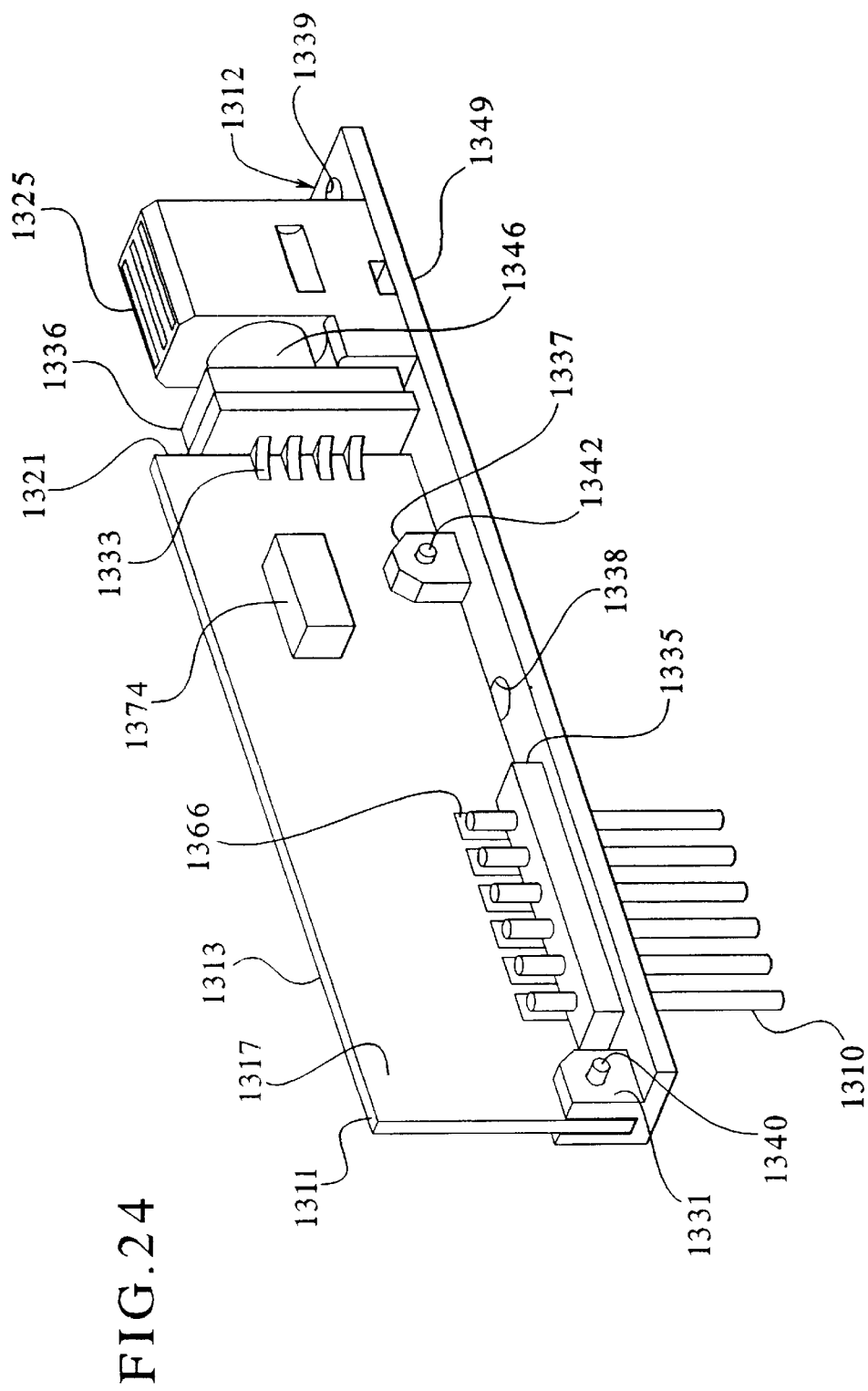
FIG. 24 is a perspective view of the one channel sub-assembly of the modular, high-density, multiple optical transmitter/receiver array of FIG. 23 taken from another angle.

FIG. 24 is a perspective view of the one channel sub-assembly 1312 of the modular, high-density multiple optical transmitter/receiver array 1300 of FIG. 23 taken from another angle. FIG. 24 shows in more detail the connection of the connection pins 1310 to the component side 1317 of substrate 1311 by being soldered to contact pads 1366 adhered to the substrate 1311. Due to the small size of the array 1300 the substrate 1311 is very thin (i.e., 0.020 inch), as such, the substrate 1311 is preferably made of alumina and forms a ceramic thick film circuit assembly. Typical printed circuit board materials such as FR4 are not well suited since such a thin substrate would result in a substrate that is not suitably rigid, mechanically. A substrate which is not suitably mechanically rigid may deflect too much and render the electronics adhered thereto unuseable. Components such integrated circuit chips, resistors, capacitors, and inductors may be placed on the substrate 1311. Numeral designator 1374 represents an electrical component such as an integrated circuit chip, a resistor, a capacitor, and an inductor, or any other device. Furthermore, more than one electrical component can be placed on the substrate. No specific circuitry and components are shown on the substrate 1311 in FIG. 24, however, typical signal conditioning circuitry and elements are adhered thereto in practice. Such circuitry and elements are discussed in U.S. Pat. No. 5,638,390 and U.S. Reissue Pat. No. Re 36,491 both of which are hereby incorporated herein by reference.

Additionally, FIG. 24 shows the solder 1333 electrically attaching the small format optical subassembly 1336 to the substrate 1311 along edge 1321. The solder 1333 also mechanically attaches the small format optical subassembly 1336 to the substrate 1311. Four solder 1333 locations are shown, however, more can be used so as to secure the small format optical subassembly 1336 to the substrate 1311.

Figure 25:
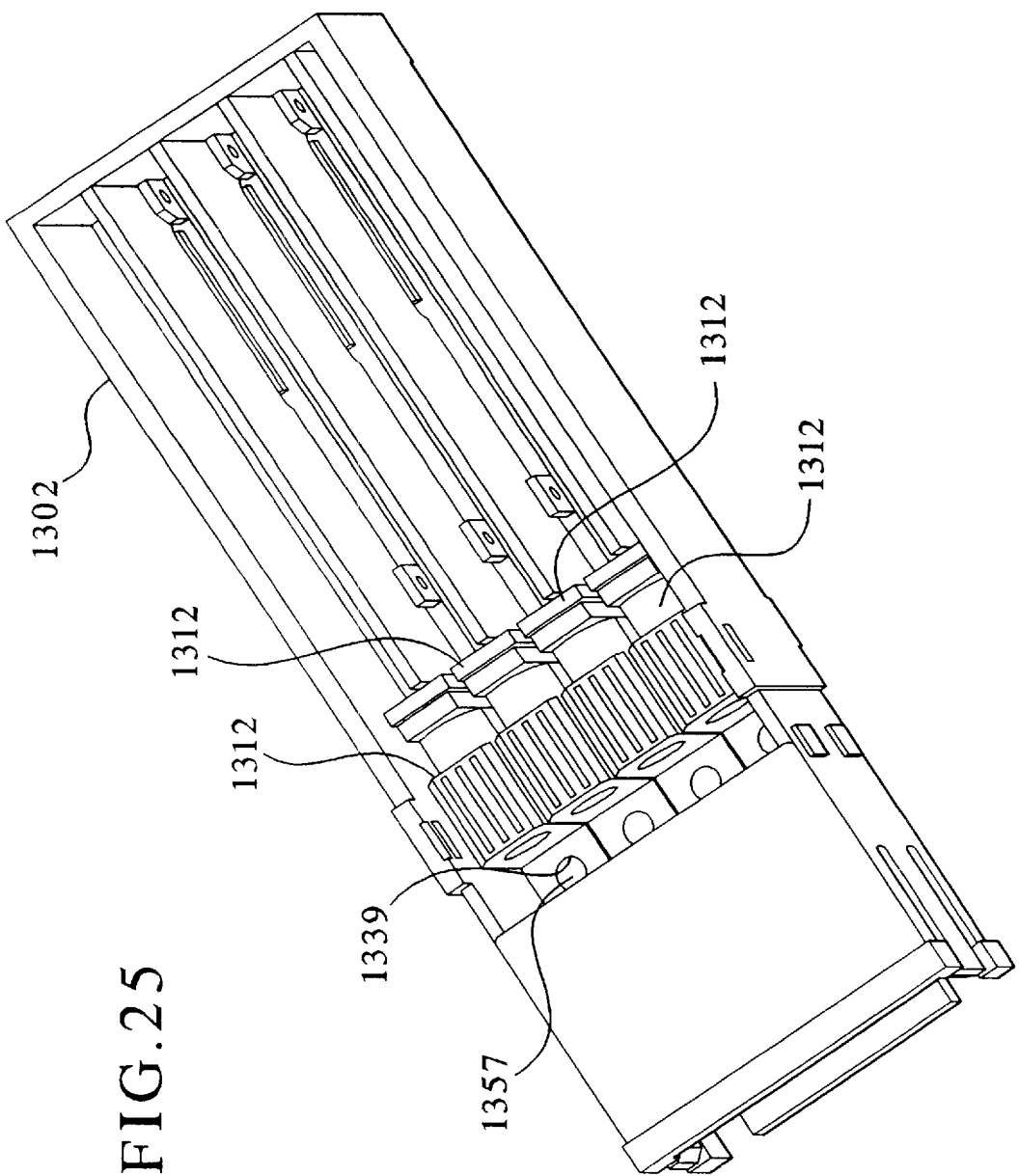
FIG. 25 is a perspective view of the housing of the modular, high-density, multiple optical transmitter/receiver array of FIG. 22 having four one channel sub-assemblies mounted therein.

FIG. 25 is a perspective view of the housing 1302 of the modular high-density, multiple optical transmitter/receiver array 1300 of FIG. 22 having four one channel sub-assemblies 1312 mounted therein.

Figure 26:
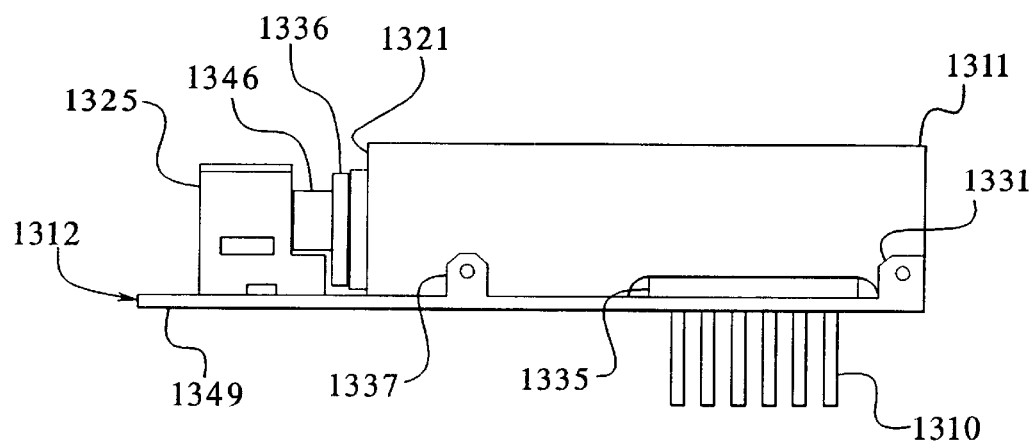
FIG. 26 is a side view of the one channel sub-assembly of FIG. 24.

FIG. 26 is a side view of the one channel sub-assembly 1312 of FIG. 24.

Figure 27:
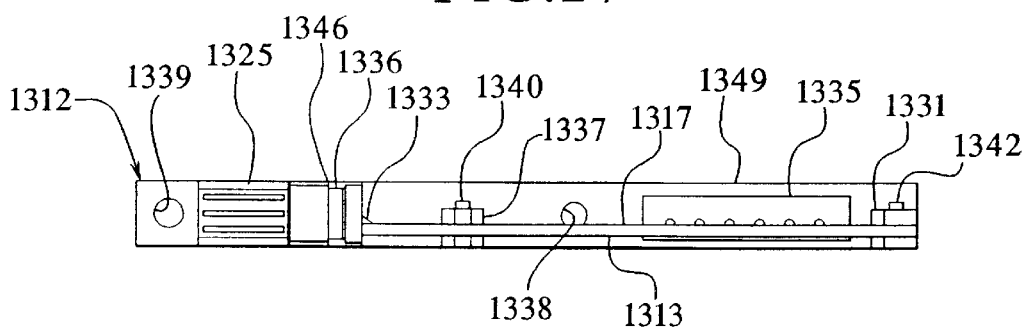
FIG. 27 is a top view of the one channel sub-assembly of FIG. 26.

FIG. 27 is a top view of the one channel sub-assembly 1312 of FIG. 26. FIG. 27 more clearly shows the soldered joint connection 1333 between the component side 1317 of the substrate 1311 with the small format optical sub-assembly 1336. Furthermore, the component side 1317 and the conductive layer side 1313 of the substrate 1311 are more clearly distinguished. The component side 1317 of the substrate 1311 is so named since there is more space onto which to mount components such as resistors, capacitors, and integrated circuit chips. The conductive layer side 1313 of the substrate 1311 is so named since there is not as much available space and as such, preferably, thick film type of conductive layers are applied to the surface of side 1313. That is the distance from side 1317 to an edge of the base 1349 is greater than a distance from side 1313 to an opposite edge of base 1349 to accommodate regular electronic components available in the market.

Figure 28:
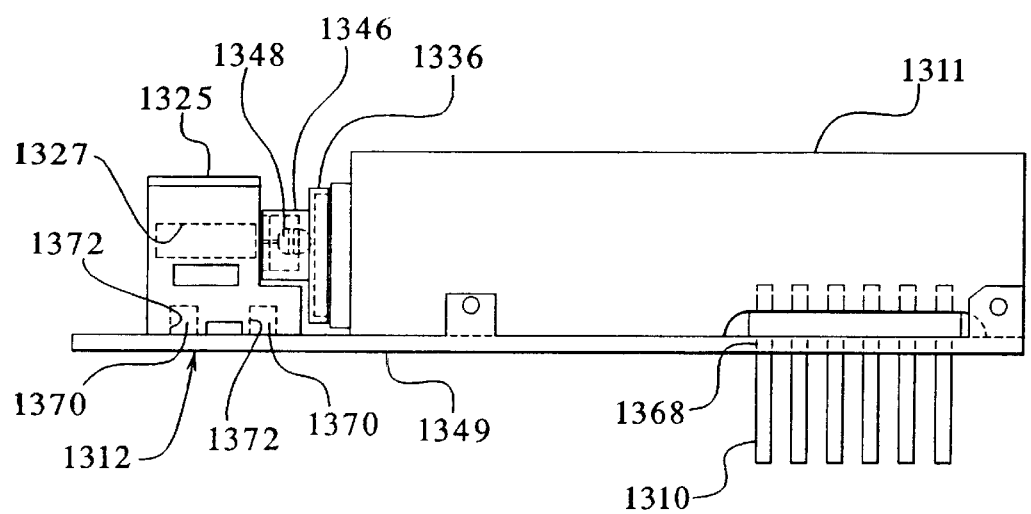
FIG. 28 is a side view of the one channel sub-assembly of FIG. 27 showing interior details.

FIG. 28 is a side view of the one channel sub-assembly 1312 of the FIG. 27 showing interior details such as the focusing element or ball lens 1348 and the ferrule receiving bore 1327 of the optical coupling element 1325. Further shown is the metal ring 1346 of the optical coupling element 1325 adjoining the small format optical sub-assembly 1326. FIG. 28 also shows the contact pins 1310 passing through holes 1368 formed in the base 1349. The optical coupling element 1325 has two protrusion receiving bores 1372. Each protrusion receiving bore 1372 of the optical coupling element 1325 accepts a protrusion 1370 projecting from the base 1349. Thus, the optical coupling element 1325 is mounted to the base 1349.

Figure 29:
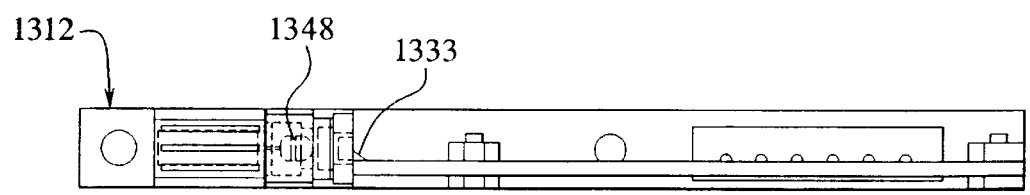
FIG. 29 is a top view of the one channel sub-assembly of FIG. 28 showing interior details.

FIG. 29 is a top view of the one channel sub-assembly 1312 of FIG. 28 showing interior details such as the focusing element which is a spherical ball lens 1348. Additionally, the soldered joint connection 1333 is further shown.

Figure 30:
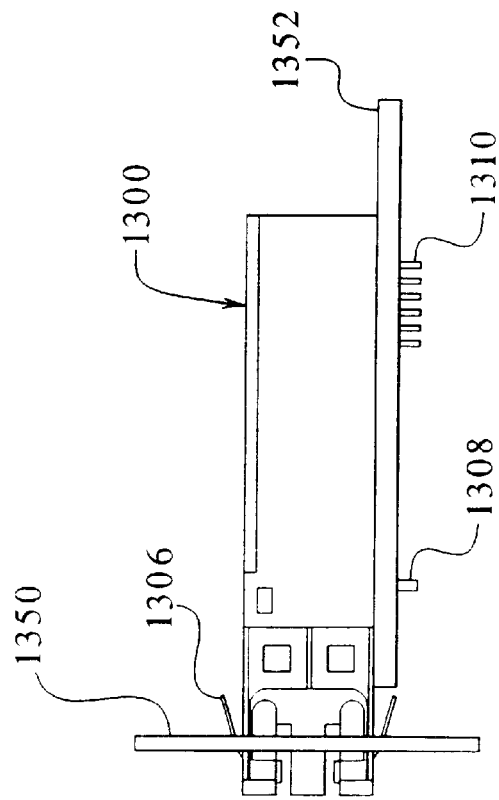
FIG. 30 is a side view of the modular, high-density, multiple optical transmitter/receiver array of FIG. 20 mounted to a board of a host device and to a backplane or chassis of a host device.

FIG. 30 is a side view of the modular high-density, multiple optical transmitter/receiver array 1300 of FIG. 20 mounted to a board 1352 of a host device. Also shown is the chassis panel 1350 of the host device. Furthermore, the ground clip 1306 is in electrical contact with the host device. Furthermore, the alignment pins 1308 align the array 1300 with the board 1352. The connection pins 1310 are electrically connected to traces on the board 1352 of the host device.

Figure 31:
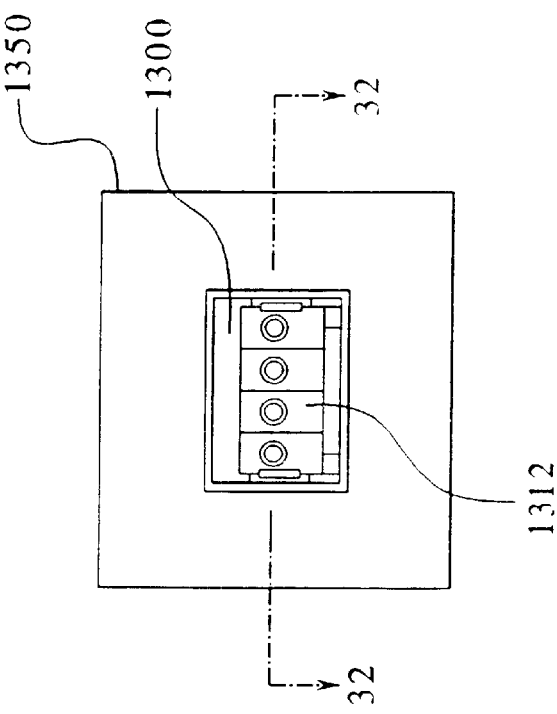
FIG. 31 is a front view of the modular, high-density, multiple optical transmitter/receiver array of FIG. 30 showing panel cutouts.

FIG. 31 is a front view of the modular, high-density multiple optical transmitter/receiver array 1300 of FIG. 30. Further, the four one channel sub-assemblies 1312 are shown.

Figure 32:
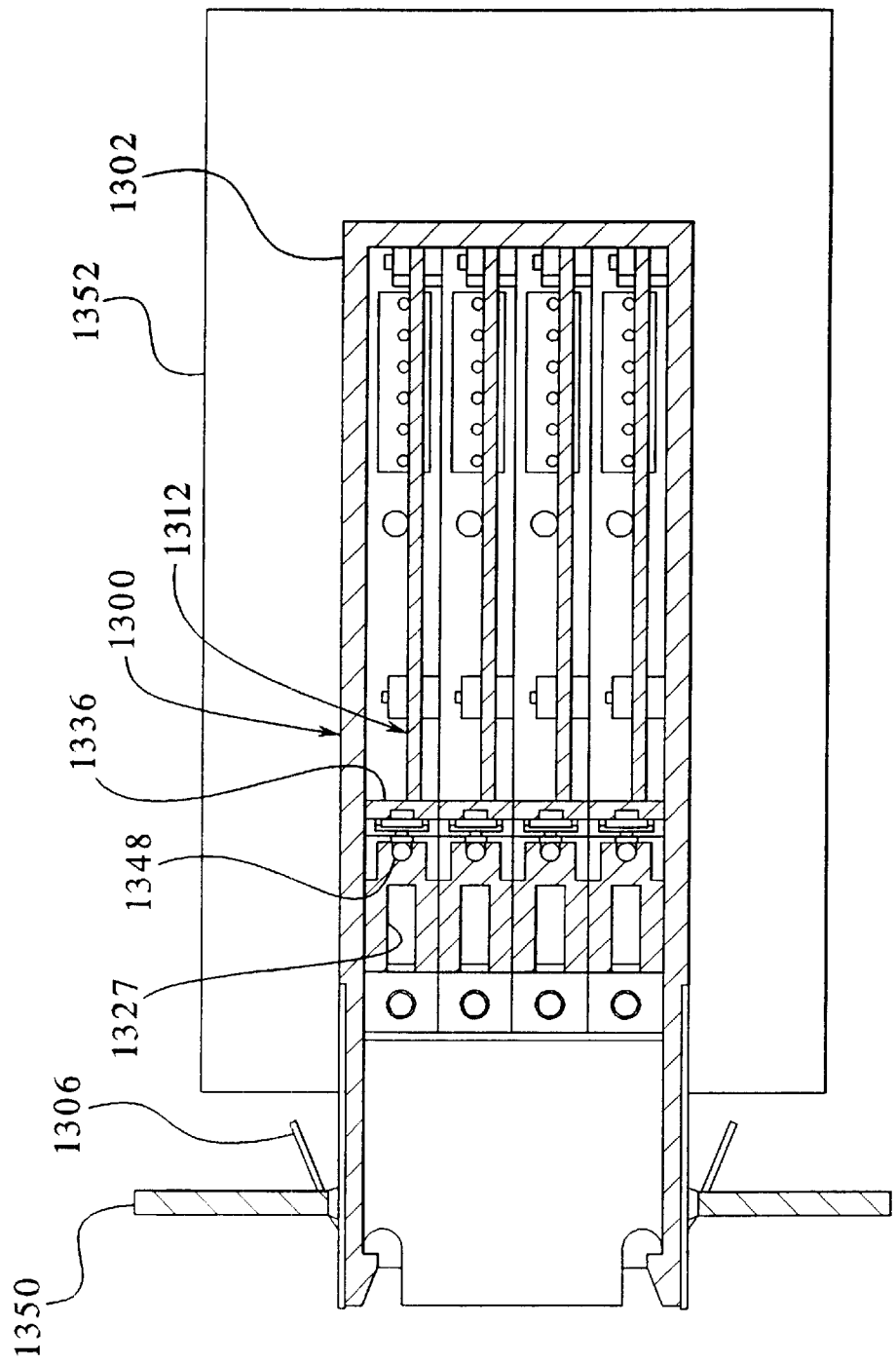
FIG. 32 is a cross-sectional, top view of the modular, high-density, multiple optical transmitter/receiver array of FIG. 31 taken along section line 32—32.

FIG. 32 is a cross-sectional, top view of the modular high-density multiple optical transmitter/receiver 1300 of FIG. 31 taken along section line 32—32. FIG. 32 shows the ground clip 1306 contacting the chassis 1350 so as to ground the structure. Furthermore the ferrule receiving bore 1327 is shown in alignment with the ball lens 1348 and the transparent element of the small format optical sub-assembly 1326.

FIG. 33 is a perspective view of a plug connector 1354. FIG. 33 shows ferrules 1358 connected to the housing 1356 of the plug connector 1354. Each ferrule has a diameter of approximately 1.25 mm. Additionally, keying structure 1302 is shown which is complementary to the keying feature 1314 of the array 1300.

FIG. 34 is a top view of the plug connector 1354.

FIG. 35 is a side view of the plug connector 1354 of FIG. 33. FIG. 35 also shows compatible latching structures which mate with the latches 1344 of the housing 1302. The compatible latching structure is denoted by numeral designator 1360.

FIG. 36 is a bottom view of the plug connector 1354 of FIG. 33.

Assembly of the one channel sub-assembly 1312 is eased due to the modularity of the components mounted to the base 1349. Initially, the small format optical subassembly 1336 is laser welded to the metal ring 1346 of the optical coupling element 1325. The protrusion receiving holes 1372 of the optical coupling element 1325 are then mounted on and frictionally engaged to protrusions 1370 of the base 1349. Then, the connection pins 1310 are passed through the holes 1368 of the base 1349 until the connection pin header 1335 abuts the base 1349. Next, the substrate 1311 is mounted in the devises 1331 and 1337 and retained therein by pins 1340 and 1342. Finally, the leads or contacts of the small format optical subassembly are soldered to electrical leads or traces formed on the component side 1317 of the substrate 1311 and the connection pins 1310 are soldered to pads 1366 formed on the component side 1317 of the substrate 1311. Electrical components on the component side 1317 may communicate with electrical components or devices or layers on the conductive layer side 1313 through conductive vias and other known methods. Assembly of the one channel sub-assembly 1312 is complete. The modularity of the design allows for ease of assembly and also increases the production yield of the part since any defective sub-components such as connection pins, small format optical subassemblies, or optical coupling elements can be identified during assembly and removed from the base 1349 before proceeding further with the assembly process.

During assembly, the one channel sub-assembly 1312 is introduced into the housing 1302. The alignment protrusion 1326 of the housing 1302 mates with the protrusion hole 1338 of the base 1349 of the one channel sub-assembly 1312, the alignment protrusion 1357 of the housing 1302 mates with the protrusion hole 1339 of the base 1349 of the one channel sub-assembly 1312, and the connection pins 1310 of the one channel sub-assembly 1312 pass through the cut-out 1320 of the housing 1302. When the fourth one channel sub-assembly 1312 is placed in the housing 1302, the assembly appears as shown in FIG. 25. The cover 1304 is than attached to the housing 1302. The cover 1304 has protruding portions which are complementary to the front and rear latch detents 1316, 1318, 1320 of the housing 1302. The cover 1304 and the housing 1302 retain the four one channel sub-assemblies 1312 therein. Next, the ground clip 1306 is wrapped around an end of the array. The ground clip 1306 attaches to and is retained by the ground clip protrusions 1330 and the ground clip cut-outs 1332 of the housing 1302.

The cover 1304 and the housing 1302 are made of a polymer. The molded cover 1304 and the housing 1302 are then metallized.

The ground clip 1306 is made of an electrically conductive metallic material. The ground clip 1306 is electrically connected to the cover 1304 and the housing 1302.

In practice, the array 1330 is attached to a board 1352 of a host device as shown in FIGS. 30 and 32. The board 1352 has traces which are electrically connected to the connection pins 1310. Additionally, the board 1352 has locating holes which accept the alignment pins 1308 so as to properly align the array 1300 relative to the board 1352 and to the chassis or backplane 1350 of the host device. FIGS. 30 and 32 show the ground clip 1306 of the array 1300 touching and electrically connected to the chassis 1350 of the host device so as to ground the array 1300 to the host device. Each pin of the connection pins 1310 transmits either power, ground, or electrical signals.

While the array 1300 is in the factory or even out in the field, the ground clip 1306 and the cover 1304 can be removed from the housing 1304 so as to expose the one channel sub-assemblies 1312. Individually, each one channel sub-assemblies 1312 can be removed from the housing 1302 by introducing a tool through the push-out holes 1324, 1334 of the housing 1302. By continuing to introduce the tool through the push-out holes 1324, 1334 which are aligned with a specific one channel sub-assembly 1312, the tool touches the base 1349 of the one channel sub-assembly 1312. Further introduction of the tool result in the one channel sub-assembly 1312 being ejected from the housing 1302. Such an ability is desirable since the array 1300 can be modified to contain only transmitter one channel assemblies 1312 or only receiver one channel assemblies 1312 or a combination thereof Furthermore, if a one channel sub-assembly becomes inoperative, the inoperative one channel sub-assembly 1312 can be removed from the housing 1302 and be either repaired or replaced. Additionally, during the assembly and testing of the arrays 1300, if a defective one channel sub-assembly 1312 is found, the entire array 1300 need not be scrapped, the defective one channel sub-assembly 1312 is merely replaced. This results in increased yields.

Figure 37:
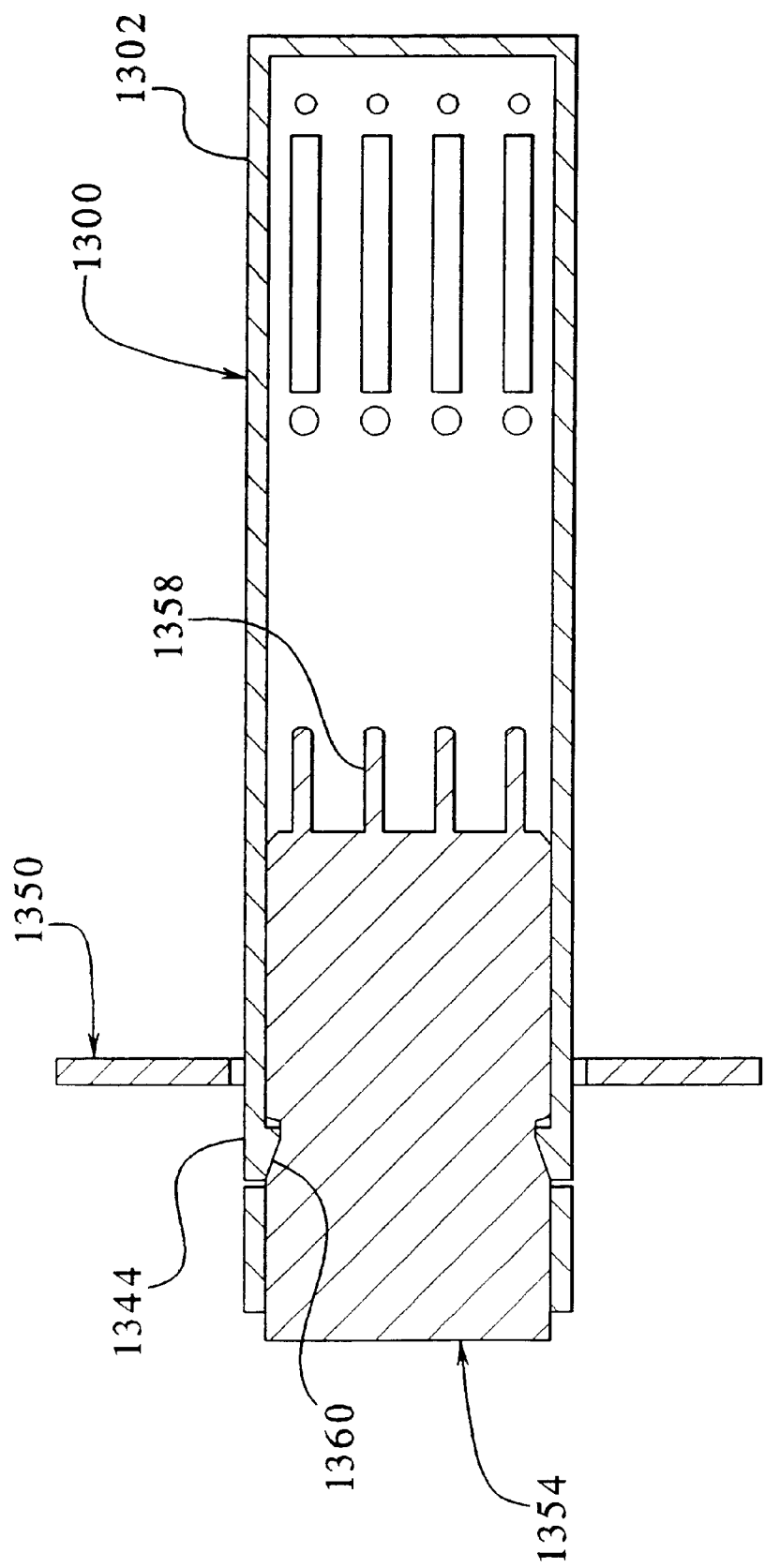
FIG. 37 is a cross-section view of the plug connector of FIG. 33 mated with the housing of the modular, high-density, multiple optical transmitter/receiver array of FIG. 22 with the one channel sub-assembles removed.

Once the array 1300 is installed in the chassis 1350, 1350 of the host device, the array 1300 is ready to receive the plug connector 1354. The ferrules 1358 of the plug connector 1354 are complementary to the ferrule receiving bores 1327 of the four one channel sub-assemblies 1312 of the array 1300. The plug connector 1354 has a latch detent 360 which is complementary to the latch 1344 of the housing 1302 of the array 1300 as shown in FIG. 37. Upon insertion of the plug connector 1354 into the array 1300, the plug connector 1354 is retained in the array 1300 due to the interaction between the latch detent 1360 of the plug connector and the latch 1344 of the array 1300. In FIG. 37 the four one channel sub-assemblies 1312 are removed for clarity.

For purposes of discussion, only an array 1300 having four one channel sub-assemblies 1312 is shown in detail. However, arrays can have any number of one channel sub-assemblies inserted therein. Preferably, arrays include either four, eight, or twelve one channel sub-assemblies which are respectfully associated with plug connectors having four, eight, and twelve ferrules attached thereto. Furthermore, it is preferable that the ferrule receiving bores 1327 of adjacent one channel sub-assemblies 1312 be separated by a distance of 3.125 mm or less.

The modular, high-density, multiple optical transmitter/receiver array 1300 has a further advantage which is not of concern with optoelectronic devices which are not so compact. Namely, as the ferrule receiving bores become closer to each other the power of the optical signals emanating from each of the ferrule receiving bores add together if the optical power signals overlap. Such overlapping becomes an issue as the positioning of the ferrule receiving bores becomes closer to each other. Individually, the power of the optical signal emanating from the ferrule receiving bore does not inherently injure an eye of a person. However, the addition of two or more optical signals may be dangerous to the health of an eye.

Standards exist which prescribe allowable optical power levels which are not to be exceeded so as to protect the human eye from injury due to the projection of an optical signal radiating out of a device. One such standard is set forth by the Center for Disease and Radiation Health which describes and sets power levels for accessible optical power which is inherently safe for the eye of a human (Class I). Another such standard is set forth by the International Electrotechnical Committee (IEC 825).

Figure 38:
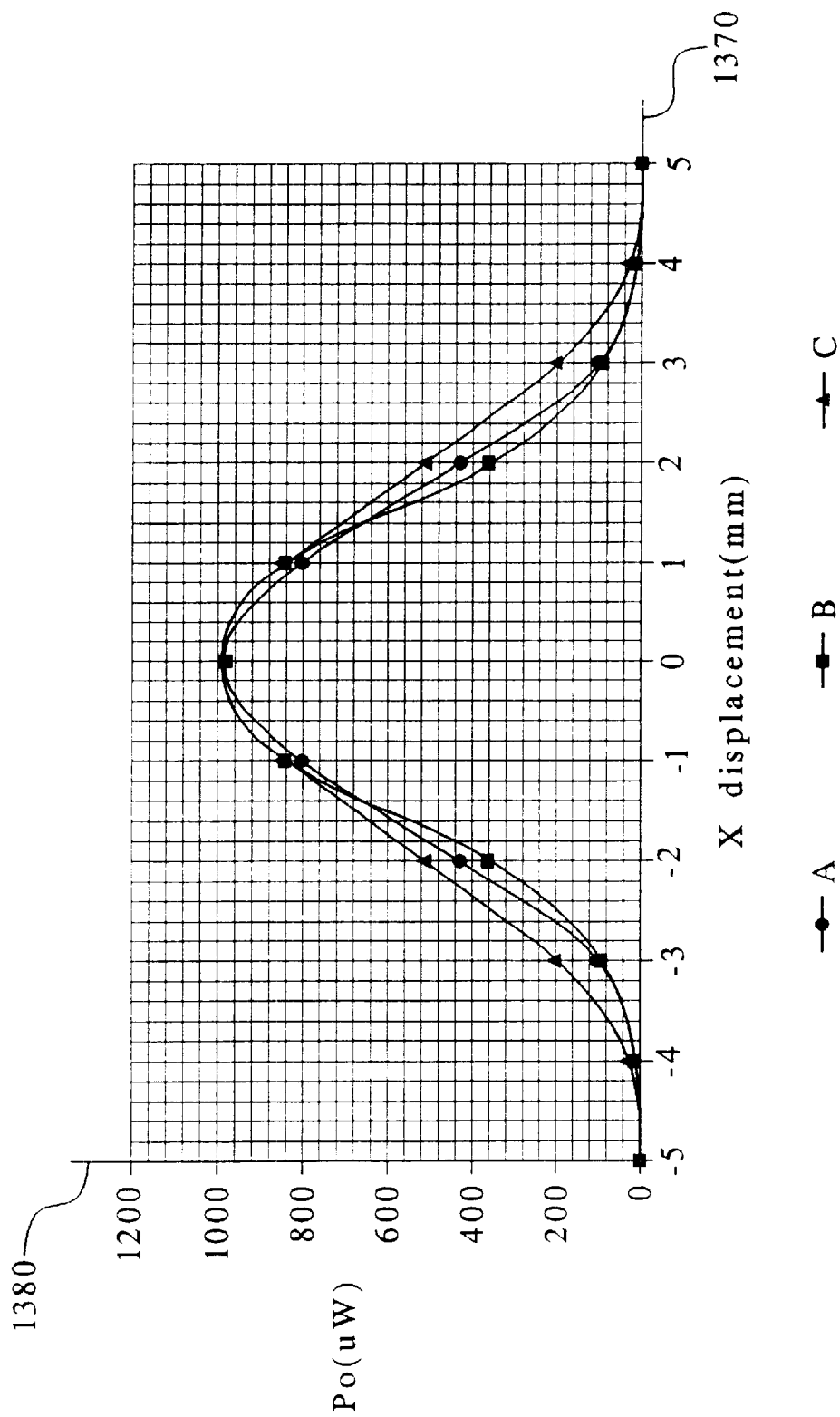
FIG. 38 is a graph of vertical cavity surface emitting laser free space accessible power versus lateral displacement.

FIG. 38 is a graph of the power output of three different vertical cavity surface emitting laser (VCSEL) designs versus displacement and is entitled: normalized VCSEL free space test comparison. Each VCSEL was tested independently. Generally, during the test, the VCSEL is set a fixed distance away from a stationary target and passed through an aperture which is located between the target and the VCSEL. The test conditions are prescribed by the standard setting organizations. Maximum power is received when the VCSEL is not displaced laterally away from the target. However, as the VCSEL is displaced laterally, the power of the optical signal as received by the target is decreased. The vertical axis 1380 identifies optical power levels in units of micro-Watts as received by the target. The horizontal axis 1390 identifies the lateral displacement in millimeters of the VCSEL away from the target. The first VCSEL tested is identified by rhombuses on the graph and is also identified by the letter A in the key at the bottom of the figure. The second VCSEL tested is identified by squares on the graph and is also identified by the letter B in the key at the bottom of the figure. The third VCSEL tested is identified by triangles on the graph and is also identified by the letter C in the key at the bottom of the figure.

Thus, by studying FIG. 38, if the VCSEL is laterally displaced one millimeter the power as received by the target is only approximately eighty percent of the full power level. Therefore, if the optical axis of two VCSEL are placed two millimeter apart the power of their optical signals combine at a location one millimeter from each ferrule receiving bore and create a power level which is expected to be approximately sixty percent greater than the full power optical signal of a single undisplaced VCSEL. Such a power level can be considered potentially injurious to an eye.

The device of the invention has ferrule receiving bores on center of 3.125 mm. Thus, the midway point between adjacent ferrule receiving bores is 1.5625 mm. By studying the graph of FIG. 38 the power level of such a location is approximately fifty percent of the full power location. Therefore, the optical power level at the midway point is approximately equivalent to the full power level due to additional of the two optical power signals. The next adjacent ferrule receiving bore is more than four millimeters away from the midway point discussed above, and, as such, by studying the graph of FIG. 38, it contributes a negligible amount of power to the midway point discussed above. Thus, the arrayed laser optical transmitter of the invention is inherently eye safe if the individual laser transceivers are in compliance with Class I regulatory limits.

Obviously, numerous modifications and variations of the present invention are possible in light of the above teachings. It is therefore to be understood that within the scope of the appended claims, the invention may be practiced otherwise than as specifically described herein.

What is claimed is:

1. A device comprising:
a first one channel sub-assembly having a first small format optical subassembly, a first optical coupling element, and a first substrate, the first optical coupling element having a first ferrule receiving bore and a first focusing element, the first small format optical subassembly attached to the first optical coupling element and to the first substrate; and
a second one channel sub-assembly having a second small format optical subassembly, a second optical coupling element, and a second substrate, the second optical coupling element having a second ferrule receiving bore and a second focusing element, the second small format optical subassembly attached to the second optical coupling element and to the second substrate, and wherein
the second small format optical subassembly is positioned between the second substrate and the second focusing element, and wherein
the second small format optical subassembly is associated with only one optical coupling element, and wherein
the second optical coupling element is associated with only one small format optical subassembly, and wherein
the second optical coupling element has only one ferrule receiving bore and only one focusing element, and wherein
the second small format optical subassembly is positioned relative to the second substrate only along an edge of the second substrate, and wherein
the first ferrule receiving bore is parallel to the second ferrule receiving bore, and wherein
the first ferrule receiving bore is separated from the second ferrule receiving bore by a first distance.

2. The device according to claim 1 wherein the first distance is substantially 3.125 mm.

3. The device according to claim 1 wherein the first distance is 3.125 mm or less.

4. The device according to claim 1 wherein the first distance is 3.25 mm.

5. The device according to claim 1 wherein the first small format optical subassembly is a transmitter, and wherein the second small format optical subassembly is a transmitter.

6. The device according to claim 1 wherein the first small format optical subassembly is a receiver, and wherein the second small format optical subassembly is a receiver.

7. The device according to claim 1 wherein the first small format optical subassembly is a receiver, and wherein the second small format optical subassembly is a transmitter.

8. A device comprising:
a housing, the housing being metallized;
a first one channel sub-assembly removeably inserted into the housing, and wherein the first one channel sub-assembly includes a first small format optical subassembly, a first optical coupling element, and a first substrate, the first optical coupling element having a first ferrule receiving bore and a first focusing element, the first small format optical subassembly attached to the first optical coupling element and to the first substrate;
a second one channel sub-assembly removeably inserted into the housing, and wherein the second one channel sub-assembly includes a second small format optical subassembly, a second optical coupling element, and a second substrate, the second optical coupling element having a second ferrule receiving bore and a second focusing element, the second small format optical subassembly attached to the second optical coupling element and to the second substrate;
a cover removeably attached to the housing so as to retain the first one channel sub-assembly and the second one channel sub-assembly between the housing and the cover, the cover being metallized; and
a ground clip attached to the housing, and wherein
the first ferrule receiving bore is parallel to the second ferrule receiving bore, and wherein
the first ferrule receiving bore is separated from the second ferrule receiving bore by a first distance, and wherein
the second small format optical subassembly is positioned between the second substrate and the second focusing element, and wherein
the second small format optical subassembly is associated with only one optical coupling element, and wherein
the second optical coupling element is associated with only one small format optical subassembly, and wherein
the second optical coupling element has only one ferrule receiving bore and only one focusing element, and wherein
the second small format optical subassembly is positioned relative to the second substrate only along an edge of the second substrate.

9. The device according to claim 8 wherein the first distance is substantially 3.125 mm.

10. The device according to claim 8 wherein the first distance is 3.125 mm or less.

11. The device according to claim 8 wherein the first ferrule receiving bore is adapted to receive a ferrule having a diameter of substantially 1.25 mm.

12. The device according to claim 11 wherein the second ferrule receiving bore is adapted to receive a ferrule having a diameter of substantially 1.25 mm.

13. The device according to claim 12 wherein the first one channel sub-assembly provides a first optical signal when energized and wherein the second one channel sub-assembly provides a second optical signal when energized, and wherein the first optical signal and the second optical signal combine at a point distant from the device so as to have a combined optical power level, and wherein the combined optical power level does not exceed a safe optical power level whereby the combined optical power level entering an eye of a person does not cause injury to the eye of the person.

14. A one channel sub-assembly comprising:
- an optical coupling element having only one ferrule receiving bore and only one focusing element;
- a first substrate having an edge; and
- a small format optical subassembly attached to the optical coupling element and to the first substrate, the small format optical subassembly positioned relative to the first substrate only along the edge of the first substrate, the small format optical subassembly includes:
  - a non-electrically conductive second substrate having a first region and a second region, the first region having a first through-hole, and the first region having a second through-hole,
  - an electrically conductive plating substantially covering the second region,
  - an electrically conductive material substantially filling the first through-hole so as to form a first electrically conductive via, and the electrically conductive material substantially filling the second through-hole so as to form a second electrically conductive via,
  - an optical diode having a first lead and a second lead, the first lead of the optical diode electrically connected to the first electrically conductive via, and the second lead of the optical diode electrically connected to the second electrically conductive via,
  - an electrically conductive can having a first aperture and a second aperture, and
  - a transparent element mounted on and hermetically sealed to the first aperture of the electrically conductive can, and wherein
    - the second aperture of the electrically conductive can is mounted on and sealed to the electrically conductive plating adhered to the second region of the non-electrically conductive second substrate so as to hermetically seal the optical diode from an ambient atmosphere.

* * * * *